United States Patent
Arai et al.

(10) Patent No.: US 10,439,056 B2
(45) Date of Patent: Oct. 8, 2019

(54) POWER SEMICONDUCTOR DEVICE AND METHOD OF MANUFACTURING POWER SEMICONDUCTOR DEVICE

(71) Applicant: SHINDENGEN ELECTRIC MANUFACTURING CO., LTD., Chiyoda-ku, Tokyo (JP)

(72) Inventors: Daisuke Arai, Saitama (JP); Mizue Kitada, Saitama (JP); Takeshi Asada, Saitama (JP); Takeshi Yamaguchi, Saitama (JP); Noriaki Suzuki, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/060,058

(22) PCT Filed: Mar. 31, 2016

(86) PCT No.: PCT/JP2016/060857
§ 371 (c)(1),
(2) Date: Jun. 7, 2018

(87) PCT Pub. No.: WO2017/168735
PCT Pub. Date: Oct. 5, 2017

(65) Prior Publication Data
US 2018/0374939 A1   Dec. 27, 2018

(51) Int. Cl.
*H01L 29/739* (2006.01)
*H01L 29/417* (2006.01)
(Continued)

(52) U.S. Cl.
CPC ...... *H01L 29/7397* (2013.01); *H01L 29/0634* (2013.01); *H01L 29/1095* (2013.01);
(Continued)

(58) Field of Classification Search
CPC ............. H01L 29/7397; H01L 29/0634
See application file for complete search history.

(56) References Cited

U.S. PATENT DOCUMENTS 8,704,297 B1 *  4/2014  Hsieh ............... H01L 29/41766
                                                 257/330
2008/0160702 A1  7/2008  Nakazawa et al.
(Continued)

FOREIGN PATENT DOCUMENTS

| JP | H6-252090 A | 9/1994 |
| JP | 2012-160706 A | 8/2012 |
| WO | 2013/046544 A1 | 4/2013 |

OTHER PUBLICATIONS

International Search Report in PCT/JP2016/060857, dated Jun. 14, 2016, 4pp.
(Continued)

*Primary Examiner* — Marc Anthony Armand
(74) *Attorney, Agent, or Firm* — Hauptman Ham, LLP

(57) ABSTRACT

A power semiconductor device according to the present invention has a super junction structure, and includes a low-resistance semiconductor layer, an n--type column region, p--type column regions, a base region, trenches, gate insulation films, gate electrodes, source regions, interlayer insulation films, contact holes, metal plugs, p+-type diffusion regions, a source electrode and a gate pad electrode. An active element part includes an n--type column region between a predetermined p--type column region disposed closest to a gate pad part and a predetermined n--type column region disposed closest to the gate pad part among the n--type column regions which are in contact with the trenches. The present invention provides a power semiconductor device which can satisfy a demand for reduction in cost and downsizing of electronic equipment, can lower ON (Continued)

resistance while maintaining a high withstand voltage, and can possess a large breakdown resistance.

11 Claims, 12 Drawing Sheets

(51) Int. Cl.
  *H01L 29/423* (2006.01)
  *H01L 29/78* (2006.01)
  *H01L 29/06* (2006.01)
  *H01L 29/10* (2006.01)
  *H01L 29/66* (2006.01)

(52) U.S. Cl.
  CPC .. *H01L 29/41741* (2013.01); *H01L 29/41766* (2013.01); *H01L 29/42368* (2013.01); *H01L 29/42372* (2013.01); *H01L 29/66727* (2013.01); *H01L 29/66734* (2013.01); *H01L 29/7813* (2013.01); *H01L 29/7811* (2013.01)

(56) References Cited

U.S. PATENT DOCUMENTS

| | | | |
|---|---|---|---|
| 2012/0199900 A1 | 8/2012 | Oosawa et al. | |
| 2014/0103426 A1* | 4/2014 | Hsieh | H01L 29/41766 257/330 |
| 2015/0155380 A1 | 6/2015 | Schulze et al. | |
| 2015/0270385 A1 | 9/2015 | Shimomura | |

OTHER PUBLICATIONS

Search Report in NL Application No. 2018610, dated Nov. 30, 2017, 13pp.

\* cited by examiner

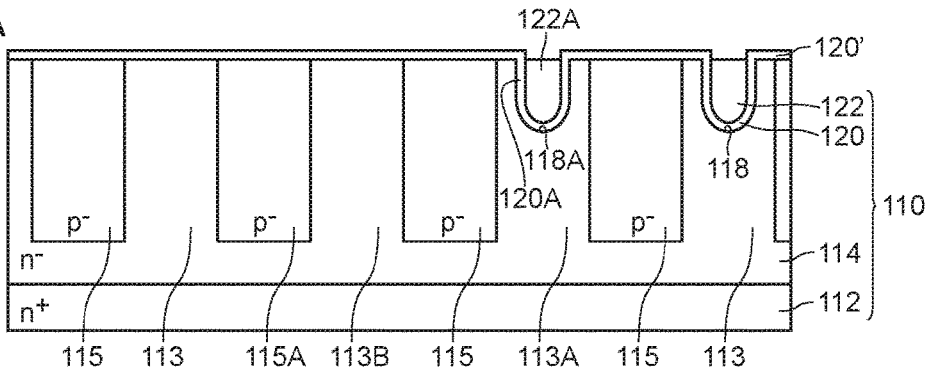
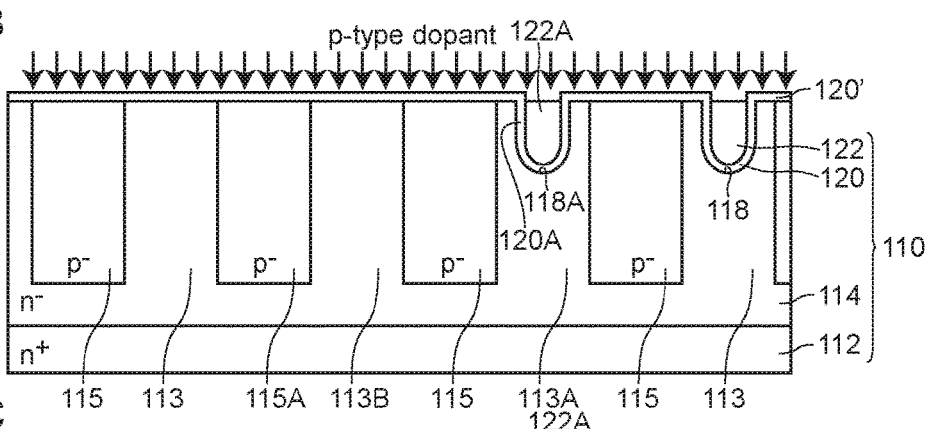
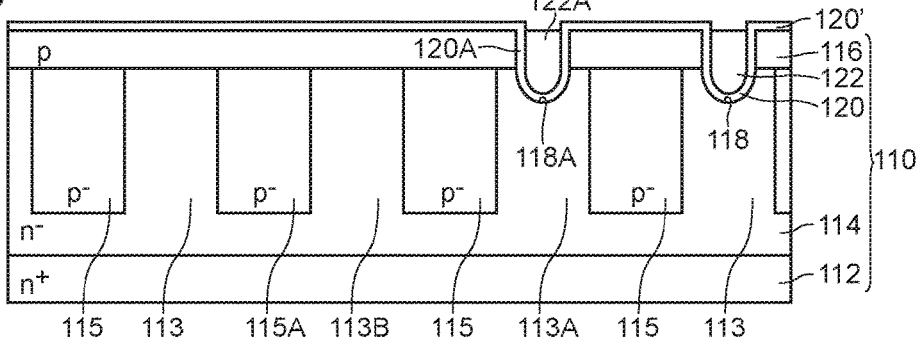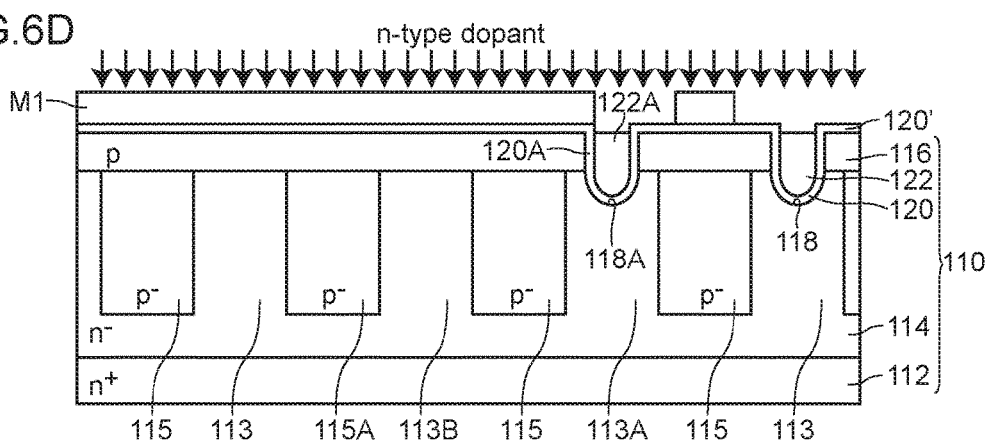

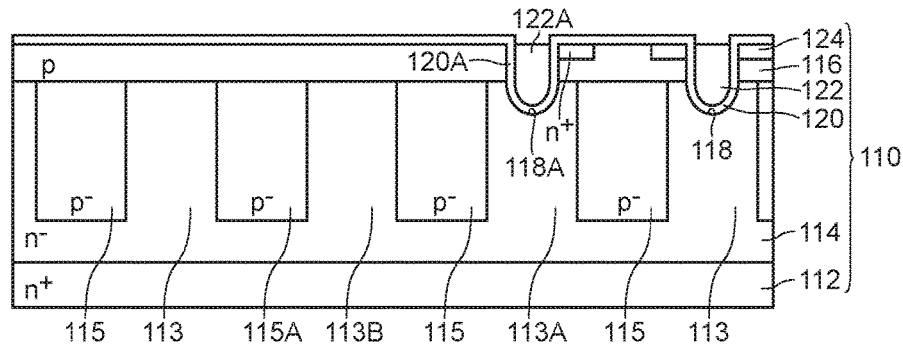
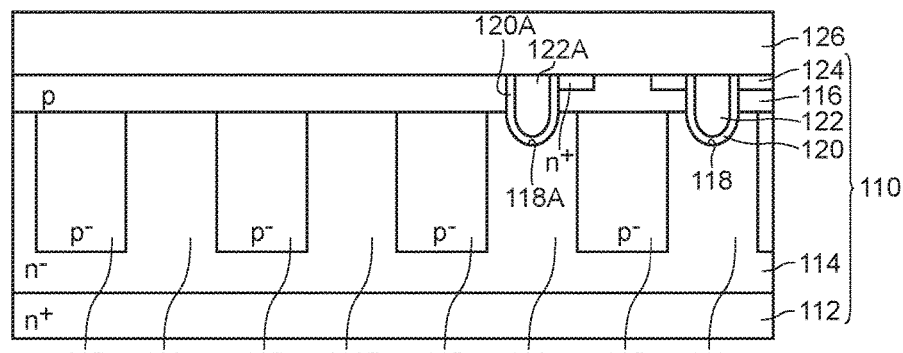
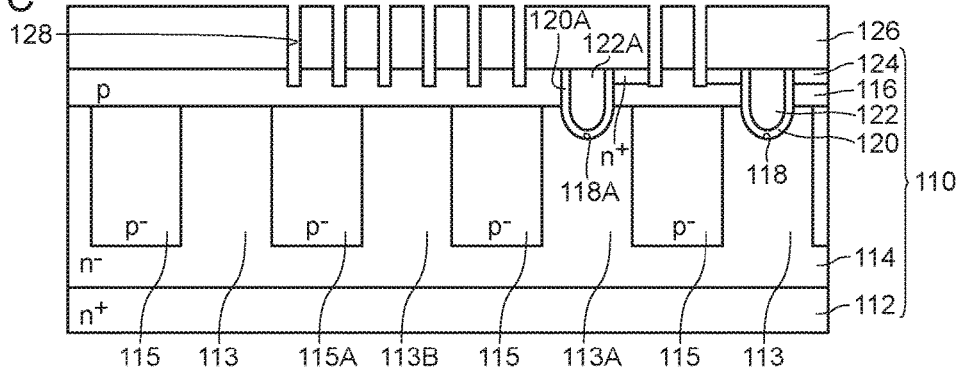
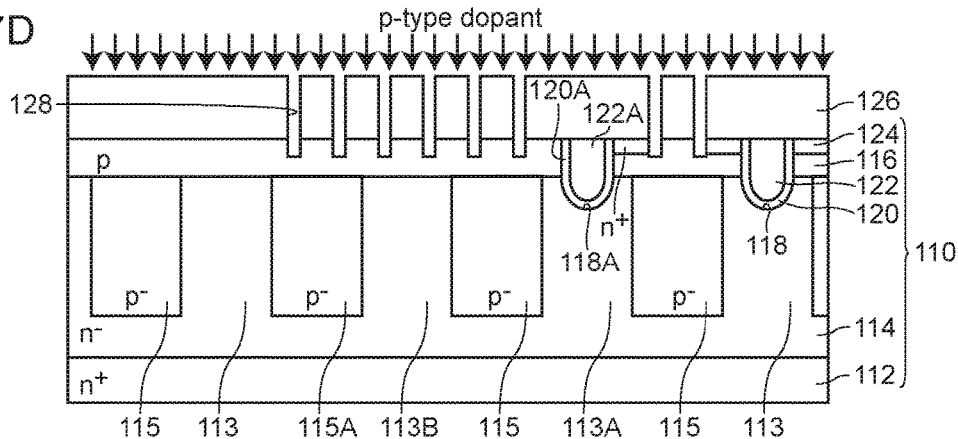

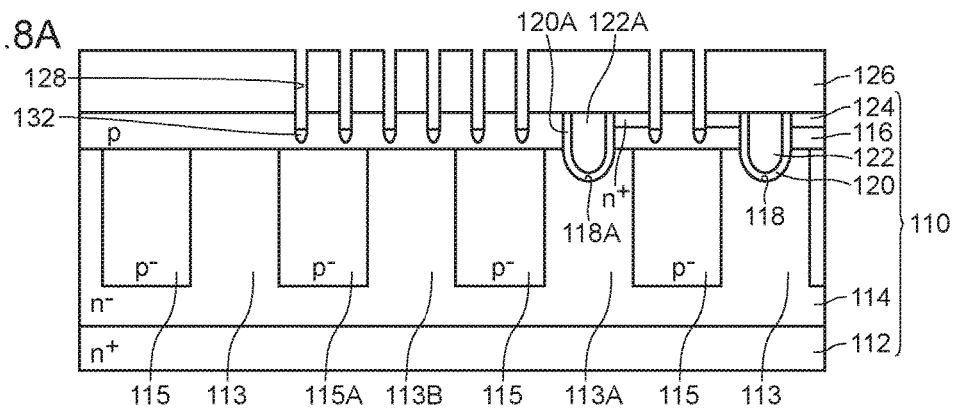
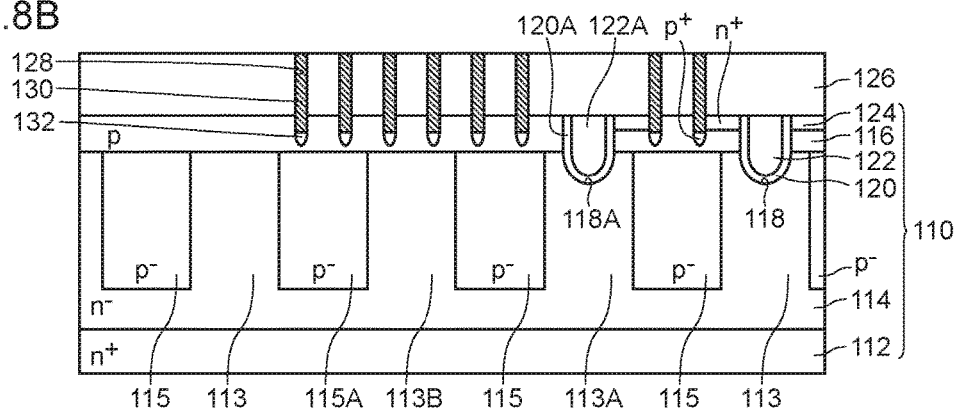
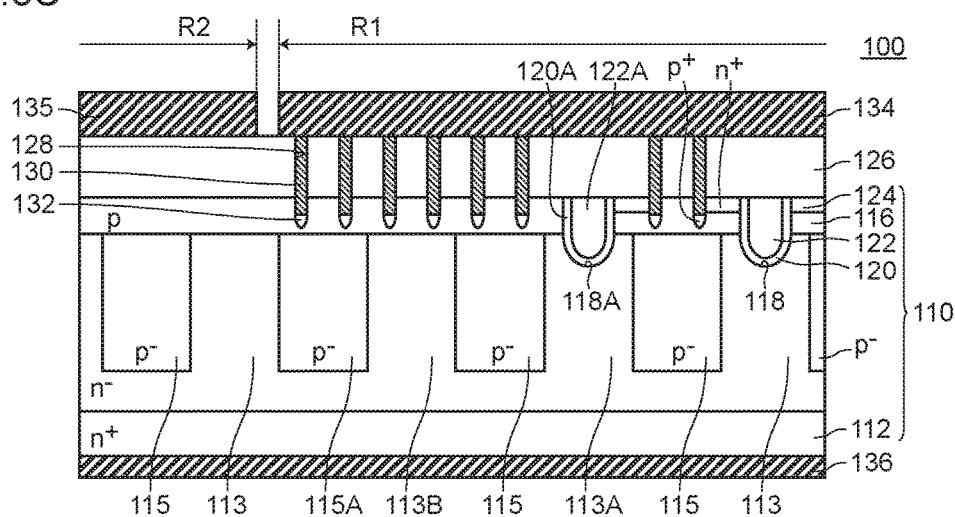

POWER SEMICONDUCTOR DEVICE AND METHOD OF MANUFACTURING POWER SEMICONDUCTOR DEVICE

RELATED APPLICATIONS

The present application is a National Phase of International Application Number PCT/JP2016/060857, filed Mar. 31, 2016.

TECHNICAL FIELD

The present invention relates to a power semiconductor device and a method of manufacturing a power semiconductor device.

BACKGROUND ART

Recently, along with a demand for reduction in cost and the downsizing of electronic equipment, a miniaturized power MOSFET has been requested. As such a power MOSFET, a power MOSFET 900 shown in FIG. 17 is considered where source electrodes 934 and a source region 924 are electrically connected to each other through metal plugs 930 (for example, see patent literature 1 with respect to a semiconductor device using metal plugs).

A power MOSFET 900 according to Background Art is a power semiconductor device which has a super junction structure formed of an $n^-$-type column region 913 and a $p^-$-type column region 915 which are alternately arranged, and defines: an active element part R1 which is a region where a source electrode 934 is formed as viewed from an upper surface side which is a front surface side of the $n^-$-type column region 913 and the $p^-$-type column region 915 (hereinafter also simply referred to as an upper surface side); and a gate pad part R2 which is a region where a gate pad electrode 935 is formed as viewed from the upper surface side.

The active element part R1 includes: an n+-type low-resistance semiconductor layer 912; a plurality of $n^-$-type column regions 913 arranged at a predetermined interval along a predetermined direction; a plurality of $p^-$-type column regions 915 arranged alternately with the $n^-$-type column regions 913 along the predetermined direction; a p-type base region 916 formed on a front surface of the $n^-$-type column region 913 and a front surface of the $p^-$-type column region 915; a trench 918 formed in a region where the $n^-$-type column region 913 exists as viewed from the upper surface side, and is formed up to a depth position where the trench 918 penetrates the base region 916 and reaches the $n^-$-type column region 913; a gate insulation film 920 formed on an inner peripheral surface of the trench 918; a gate electrode 922 buried in the trench 918 by way of the gate insulation film 920; an $n^+$-type source region 924 formed such that the source region 924 is disposed on a front surface of the base region 916, and at least a portion of the source region 924 is exposed on the inner peripheral surface of the trench 918; an interlayer insulation film 926 configured to cover at least the source region 924, the gate insulation film 920 and the gate electrode 922; a contact hole 928 formed in a region where the $p^-$-type column region 915 exists as viewed from the upper surface side, and penetrates the interlayer insulation film 926 and reaches at least the base region 916; a metal plug 930 formed by filling predetermined metal in the contact hole 928; a $p^+$-type diffusion region 932 formed so as to be in contact with a bottom surface of the metal plug 930 and having higher dopant concentration than the base region 916; the source electrode 934 formed on the interlayer insulation film 926, and electrically connected to the base region 916, the source region 924 and the $p^+$-type diffusion region 932 through the metal plug 930; and a drain electrode 936 formed on a front surface of the low-resistance semiconductor layer 912.

The gate pad part R2 includes: the low-resistance semiconductor layer 912; the $n^-$-type column region 913; the $p^-$-type column region 915; the base region 916; the interlayer insulation film 926; the gate pad electrode 935 formed on the interlayer insulation film 926; and the drain electrode 936 formed on the low-resistance semiconductor layer 912 (for example, see patent literature 2 with respect to a power semiconductor device which has a super junction structure and in which the active element part and the gate pad part are defined).

The power MOSFET 900 according to Background Art includes the metal plug 930 and hence, unlike a power semiconductor device where the source electrode and the source region are brought into direct contact with each other, it is unnecessary to form a contact hole having a large diameter and hence, it is possible to provide a miniaturized power MOSFET. As a result, it is possible to provide a power MOSFET which can satisfy a demand for both reduction in cost and downsizing of electronic equipment.

Further, the power MOSFET 900 has the super junction structure formed of the $n^-$-type column region 913 and the $p^-$-type column region 915 which are alternately arranged. Accordingly, it is possible to lower ON resistance while maintaining a high withstand voltage.

CITATION LIST

Patent Literature

PTL 1: JP-A-6-252090
PTL 2: JP-A-2012-160706

SUMMARY OF INVENTION

Technical Problem

However, in the structure of the power MOSFET 900, there may be a case where damage is liable to occur in the vicinity of the gate insulation film 920A formed on the trench 918A disposed closest to the gate pad part R2 as viewed along a predetermined direction. The trench 918A disposed closest to the gate pad part R2 is referred to as "specific trench 918A" hereinafter, and the gate insulation film 920A formed on the specific trench 918A is referred to as "specific gate insulation film 920A" hereinafter. That is, there arises a drawback that there may be a case where it is difficult to use a power MOSFET having a large breakdown resistance as the power MOSFET 900. Such a drawback is not limited to the power MOSFET 900 and may occur in power semiconductor devices in general.

The present invention has been made to overcome the above-mentioned drawback, and it is an object of the present invention to provide a power semiconductor device which can satisfy a demand for reduction in cost and downsizing of electronic equipment, can lower ON resistance while maintaining a high withstand voltage, and can possess a large breakdown resistance. It is another object of the present invention to provide a method of manufacturing such a power semiconductor device.

Solution to Problem

The reason that damage is liable to occur in the vicinity of the specific gate insulation film is described by taking the case of the power MOSFET 900 as an example.

First, in the above-mentioned power MOSFET 900, the source electrode 934 is electrically connected not only to the source region 924 but also to the base region 916 and the p+-type diffusion region 932 through the metal plug 930 (see FIG. 18). Accordingly, when an avalanche breakdown occurs or reverse recovery of a body diode occurs, out of generated electron-hole pairs, holes h (see blanked dots indicated by symbol h in FIG. 18) are drawn to the source electrode 934 through the base region 916, the p+-type diffusion region 932 and the metal plug 930.

In this case, the metal plug 930 does not exist in the gate pad part R2 and hence, the holes h generated in the gate pad part R2 are recovered by the metal plug 930 in the vicinity of the gate pad part R2 through the base region 916. However, holes h from the gate pad part R2 are concentrated in the metal plug 930 in the vicinity of the gate pad part R2 and hence, there may be a case where holes h cannot be sufficiently recovered by using only the metal plug 930 in the vicinity of the gate pad part R2. Holes h which are not recovered by the metal plug 930 in the vicinity of the gate pad part R2 pass an area around the trench 918A and are recovered by another metal plug 930. In this case, there may be a case where holes h impart damage on the specific gate insulation film 920A, a boundary surface between the specific gate insulation film 920A and the gate electrode corresponding to the specific gate insulation film (hereinafter referred to as specific gate electrode) 922A or a boundary surface between the n−-type column region 913 and the specific gate insulation film 920A. That is, there may be a case where so-called gate breakdown or electric characteristics change due to deterioration of the specific gate insulation film 920A (see FIG. 18).

In a power MOSFET having a carrier type opposite to a carrier type of the power MOSFET 900, out of generated electron-hole pairs, electrons exhibit substantially the same behavior as the holes h. Accordingly, also in the power MOSFET having a carrier type opposite to a carrier type of the power MOSFET 900, drawbacks substantially equal to the drawbacks of the power MOSFET 900 may arise due to the same reason.

The present invention has been made based on such findings, and a power semiconductor device of the present invention has the following configurations.

[1] A power semiconductor device having a super junction structure formed of first conductive-type column regions and second conductive-type column regions where the first conductive-type column region and the second conductive-type column region are alternately arranged, and defining: an active element part which is a region where an active element electrode is formed as viewed from an upper surface side which is a front surface side of the first conductive-type column region and a front surface of the second conductive-type column region; and a gate pad part which is a region where a gate pad electrode is formed as viewed from the upper surface side, wherein the active element part includes: a low-resistance semiconductor layer; a plurality of the first conductive-type column regions arranged at a predetermined interval along a predetermined direction; a plurality of the second conductive-type column regions arranged alternately with the first conductive-type column regions along the predetermined direction; a second conductive-type base region formed on a front surface of the first conductive-type column region and a front surface of the second conductive-type column region; a trench formed in a region where the first conductive-type column region exists as viewed from the upper surface side, and is formed up to a depth position where the trench penetrates the base region and reaches the first conductive-type column region; a gate insulation film formed on an inner peripheral surface of the trench; a gate electrode buried in the trench by way of the gate insulation film; a first conductive-type high concentration diffusion region formed such that the diffusion region is disposed on a front surface of the base region, and at least a portion of the diffusion region is exposed on the inner peripheral surface of the trench; an interlayer insulation film configured to cover at least the first conductive-type high concentration diffusion region, the gate insulation film and the gate electrode; a contact hole formed in a region where at least the second conductive-type column region exists as viewed from the upper surface side, penetrates the interlayer insulation film and reaches at least the base region; a metal plug formed by filling predetermined metal in the contact hole; a second conductive-type high concentration diffusion region formed so as to be in contact with a bottom surface of the metal plug and having higher dopant concentration than the base region; and the active element electrode formed on the interlayer insulation film, and electrically connected to the base region, the first conductive-type high concentration diffusion region and the second conductive-type high concentration diffusion region through the metal plug, the gate pad part includes: the low-resistance semiconductor layer used in common with the active element part; the first conductive-type column region; the second conductive-type column region; the base region used in common with the active element part; the interlayer insulation film used in common with the active element part; and the gate pad electrode formed on the interlayer insulation film, wherein when the power semiconductor device is viewed on a predetermined cross section being parallel to the predetermined direction and including the gate pad part, the active element part includes one or more first conductive-type column regions between a predetermined second conductive-type column region disposed closest to the gate pad part among the second conductive-type column regions and a predetermined first conductive-type column region disposed closest to the gate pad part among the first conductive-type column regions which are in contact with the trench.

[2] In the power semiconductor device of the present invention, it is preferable that the active element part include the contact hole, the metal plug and the second conductive-type high concentration diffusion region also in a region where the first conductive-type column region is formed between the predetermined first conductive-type column region and the predetermined second conductive-type column region as viewed from the upper surface side.

[3] In the power semiconductor device of the present invention, it is preferable that, as viewed on the predetermined cross section, the active element part include plural sets of the contact hole, the metal plug and the second conductive-type high concentration diffusion region per each region where the second conductive-type column region is formed as viewed from the upper surface side.

[4] In the power semiconductor device of the present invention, it is preferable that the active element part include plural sets of the trench, the gate insulation film and the gate electrode, and in the active element part, the first conductive-type high concentration diffusion region be formed between two trenches disposed adjacently to each other and also only between the trench and the metal plug disposed closest to the trench.

[5] In the power semiconductor device of the present invention, it is preferable that the predetermined metal be tungsten.

[6] In the power semiconductor device of the present invention, it is preferable that the active element part include plural sets of the trench, the gate insulation film and the gate electrode, and in the active element part, a distance between two gate electrodes disposed adjacently to each other be 2.5 μm or more.

[7] In the power semiconductor device of the present invention, it is preferable that the active element part include plural sets of the trench, the gate insulation film and the gate electrode, and in the active element part, a distance between two gate electrodes disposed adjacently to each other be 5 or more times as large as a width of the metal plug.

[8] In the power semiconductor device of the present invention, it is preferable that the contact hole be formed up to a depth position which is deeper than a bottom surface of the first conductive-type high concentration diffusion region.

[9] In the power semiconductor device of the present invention, it is preferable that, using a boundary surface between the interlayer insulation film and the first conductive-type high concentration diffusion region as a reference, a depth position of a deepest portion of the base region be set to a value which falls within a range of from 0.5 μm to 2.0 μm.

[10] In the power semiconductor device of the present invention, it is preferable that the second conductive-type high concentration diffusion region be formed such that the diffusion region penetrates the base region from the bottom surface of the metal plug and reaches the second conductive-type column region or the first conductive-type column region.

[11] A method of manufacturing a power semiconductor device of the present invention is a method of manufacturing a power semiconductor device for manufacturing the power semiconductor device, the method including in the following order: a semiconductor base body preparing step of preparing a semiconductor base body having a low-resistance semiconductor layer, the plurality of first conductive-type column regions arranged at a predetermined interval along a predetermined direction and the plurality of the second conductive-type column regions arranged alternatively with the first conductive-type column regions along the predetermined direction; a trench forming step of forming a trench in a region which is defined by the active element part after manufacture and in which the first conductive-type column region exists as viewed from an upper surface side which is a front surface side of the first conductive-type column region and a front surface side of the second conductive-type column region; a gate electrode forming step of forming a gate electrode in the trench by way of the gate insulation film after formation of a gate insulation film on an inner peripheral surface of the trench; a base region forming step of forming a second conductive-type base region up to a depth position shallower than a lowermost bottom portion of the trench from front surfaces of the first conductive-type column region and the second conductive-type column region; a first conductive-type high concentration diffusion region forming step of forming the first conductive-type high concentration diffusion region on a front surface of the base region such that at least a portion of the first conductive-type high concentration diffusion region is exposed on an inner peripheral surface of the trench; an interlayer insulation film forming step of forming an interlayer insulation film which covers at least the first conductive-type high concentration diffusion region, the gate insulation film and the gate electrode; a contact hole forming step of forming a contact hole in a region which is defined by the active element part after manufacture and in which at least the second conductive-type column region exists as viewed from the upper surface side such that the contact hole penetrates the interlayer insulation film and reaches at least the base region; a second conductive-type high concentration diffusion region forming step of forming the second conductive-type high concentration diffusion region which is in contact with a bottom surface of the contact hole and has higher dopant concentration than the base region; a metal plug forming step of forming a metal plug by filling predetermined metal in the contact hole; and an electrode forming step of forming an active element part electrode which is electrically connected to the base region, the first conductive-type high concentration diffusion region and the second conductive-type high concentration diffusion region through the metal plug on the interlayer insulation film in the first region defined by the active element part after manufacture, and a gate pad electrode which is spaced apart from the active element part electrode on the interlayer insulation film in the second region defined by the gate pad part after manufacture, wherein in the trench forming step, the trench is formed such that, when the semiconductor base body is viewed on a predetermined cross section being parallel to the predetermined direction and including the second region after manufacture, in the first region, between a predetermined second conductive-type column region disposed closest to the second region among the second conductive-type column regions and a predetermined first conductive-type column region disposed closest to the second region among the first conductive-type column regions which are in contact with the trench after formation of the trench, one or more first conductive-type column regions exist.

Advantageous Effects of Invention

According to the power semiconductor device of the present invention, the power semiconductor device includes the metal plug and hence, in the same manner as the power MOSFET 900, it is unnecessary to form a contact hole having a large diameter whereby a miniaturized power semiconductor device can be manufactured. As a result, the power semiconductor device of the present invention becomes a power semiconductor device which can satisfy a demand for reduction in cost and downsizing of electronic equipment.

Further, according to the power semiconductor device of the present invention, the power semiconductor device includes a super junction structure formed of a first conductive-type column region and a second conductive-type column region which are alternately arranged. Accordingly, in the same manner as the power MOSFET 900, the power semiconductor device of the present invention can lower ON resistance while maintaining a high withstand voltage.

According to the power semiconductor device of the present invention, the power semiconductor device includes the metal plug, and when the power semiconductor device is viewed on a predetermined cross section, the active element part includes one or more first conductive-type column regions between the predetermined second conductive-type column region disposed closest to the gate pad part among the second conductive-type column regions and the predetermined first conductive-type column region disposed closest to the gate pad part among the first conductive-type column regions which are in contact with trench. In other words, the active element part includes the first conductive-type column region which is not in contact with the trench at the position close to the gate pad part. Accordingly, even when the metal plug has substantially the same configuration as the power MOSFET 900, a large number of metal plugs can be disposed between the gate pad part and the specific trench. With such a configuration, according to the power semiconductor device of the present invention, even when holes or electrons of electron-hole pairs generated in the gate pad part are not sufficiently recovered by the metal plug in the vicinity of the gate pad part, it is possible to recover the holes or electrons by other metal plugs before the holes or electrons pass through an area in the vicinity of the specific trench (see FIG. 3 described later).

As a result, according to the power semiconductor device of the present invention, it is possible to prevent the occurrence of a case where holes or electrons impart damage on the specific gate insulation film, a boundary surface between the specific gate insulation film and the specific gate electrode or a boundary surface between the n⁻-type column region and the specific gate insulation film when an avalanche breakdown occurs or reverse recovery of a body diode occurs. That is, it is possible to prevent so-called gate breakdown or a change in electric characteristics caused by the deterioration of the specific gate insulation film. Accordingly, the power semiconductor device according to the present invention becomes a power semiconductor device possessing a large breakdown resistance.

Accordingly, as the power semiconductor device of the present invention, it is possible to provide a power semiconductor device which can satisfy a demand for reduction in cost and downsizing of electronic equipment, can lower ON resistance while maintaining a high withstand voltage, and can possess a large breakdown resistance.

According to the method of manufacturing a semiconductor device of the present invention, the metal plug is formed, the semiconductor base body having the plurality of first conductive-type column regions and the plurality of second conductive-type column regions is prepared in the semiconductor base body preparing step, and in the trench forming step, the trench is formed such that, when the semiconductor base body is viewed on a predetermined cross section, in the first region defined by the active element part after manufacture, between the predetermined second conductive-type column region and the predetermined first conductive-type column region, one or more first conductive-type column regions exist. Accordingly, it is possible to manufacture a power semiconductor device of the present invention which can satisfy a demand for reduction in cost and downsizing of electronic equipment, can lower ON resistance while maintaining a high withstand voltage, and can possess a large breakdown resistance.

The advantageous effect "can lower ON resistance while maintaining a high withstand voltage" acquired by the power semiconductor device of the present invention is, as can be understood from the fact that the above-mentioned conventional power MOSFET 900 also has substantially the same advantageous effect, an advantageous effect acquired by the power semiconductor device of the present invention compared to a power semiconductor device which does not have super junction structure.

Compared to the conventional power semiconductor device having the super junction structure (for example, the power MOSFET 900 according to Background Art), the number of trenches is decreased by one in the power semiconductor device of the present invention (for example, see a power semiconductor device 100 according to the embodiment 1 described later). Accordingly, to consider the advantageous effect "can lower ON resistance while maintaining a high withstand voltage" from this point of view, it may not be reasonable to list the advantageous effect "can lower ON resistance while maintaining a high withstand voltage" as the advantageous effect of the present invention. However, in the miniaturized power semiconductor device, a change in the number of trenches by one generates substantially no difference in performances of the power semiconductor device. From this point of view, it is safe to say that the power semiconductor device of the present invention has the advantageous effect "ON resistance is minimally increased and a high withstand voltage can be maintained compared to the conventional power semiconductor device which has the super junction structure".

BRIEF DESCRIPTION OF DRAWINGS

FIG. 1 corresponds to a cross section taken along a line A1-A1 in FIG. 2 described later. Symbol 110 indicates a semiconductor base body.

In FIG. 2, to facilitate the understanding of the configuration of gate electrodes 122 and metal plugs 130, constitutional elements other than the gate electrode 122, the metal plugs 130, a gate pad electrode 135 and a gate finger 138 are not shown in the drawing, or are not indicated by symbols. Further, in FIG. 2, the structure disposed outside the gate finger 138 (a withstand voltage region and the like) is not shown in the drawing.

FIG. 6A to FIG. 6D are cross-sectional views for describing a method of manufacturing the power semiconductor device according to the embodiment 1, and also are views showing the respective steps of the method.

FIG. 7A to FIG. 7D are cross-sectional views for describing a method of manufacturing the power semiconductor device according to the embodiment 1, and also are views showing the respective steps of the method.

FIG. 8A to FIG. 8C are cross-sectional views for describing a method of manufacturing the power semiconductor device according to the embodiment 1, and also are views showing the respective steps of the method.

In FIG. 14, to facilitate the understanding of the configuration of gate electrodes 122 and metal plugs 130, constitutional elements other than the gate electrodes 122, the metal plugs 130, a gate pad electrode 135 and a gate finger 138 are not shown in the drawing, or are not indicated by symbols. Further, in FIG. 14, the structure disposed outside a gate finger 138 (a withstand voltage region and the like) is not shown in the drawing.

DESCRIPTION OF EMBODIMENTS

Figure 1:
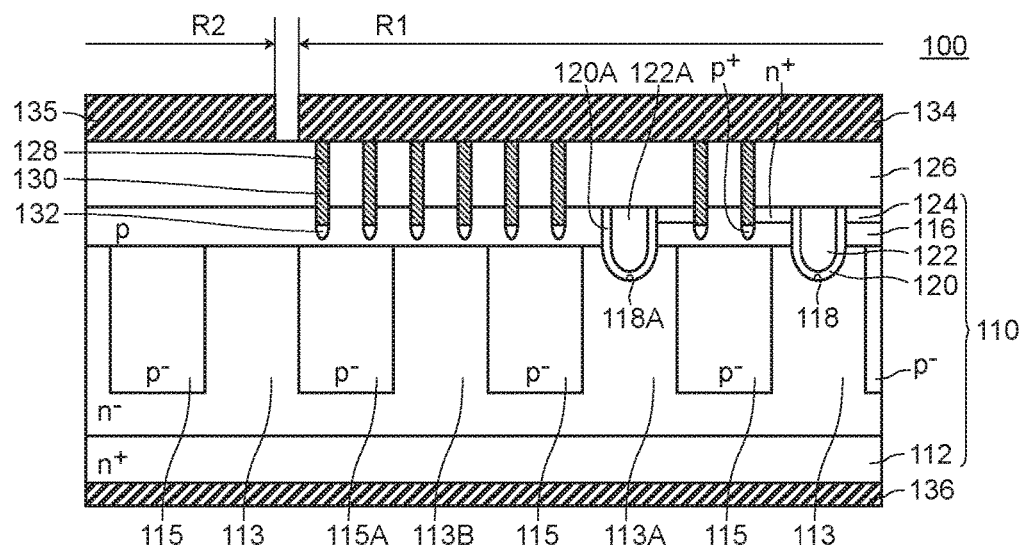
FIG. 1 is a cross-sectional view showing a part of a power semiconductor device 100 according to an embodiment 1. Hereinafter, "a cross-sectional view showing a part of a power semiconductor device" is simply described as "cross-sectional view".

Hereinafter, a power semiconductor device and a method of manufacturing a power semiconductor device of the present invention are explained based on embodiments shown in the drawings. The respective drawings are schematic views, and it is not always the case that the respective drawings strictly reflect sizes and positional relationships of actual constitutional elements. Further, even when constitutional elements differ in shapes or the like between the respective embodiments, in the case where fundamental functions of these constitutional elements are substantially equal, substantially the same symbols are used in the respective embodiments.

Embodiment 1

1. Configuration of Power Semiconductor Device 100 According to Embodiment 1

The power semiconductor device 100 according to the embodiment 1 is a trench-gate power MOSFET used in various power source devices such as a DC-DC converter. A withstand voltage of the power semiconductor device 100 according to the embodiment 1 is set to 300V or more, and is 600V, for example.

As shown in FIG. 1, the power semiconductor device 100 according to the embodiment 1 is a power semiconductor device which has a super junction structure formed of an $n^-$-type column region 113 and a $p^-$-type column region 115 which are alternately arranged, and defines: an active element part R1 which is a region where a source electrode 134 is formed as viewed from an upper surface side which is a front surface side of the $n^-$-type column region 113 and the $p^-$-type column region 115; and a gate pad part R2 which is a region where a gate pad electrode 135 is formed as viewed from the upper surface side.

The active element part R1 includes: an $n^+$-type low-resistance semiconductor layer 112; a plurality of $n^-$-type column regions 113 arranged at a predetermined interval along a predetermined direction; a plurality of $p^-$-type column regions 115 arranged alternately with the $n^-$-type column regions 113 along the predetermined direction; a p-type base region 116 formed on a front surface of the $n^-$-type column region 113 and a front surface of the $p^-$-type column region 115; a trench 118 formed in a region where the $n^-$-type column region 113 exists as viewed from the upper surface side, and is formed up to a depth position where the trench 118 penetrates the base region 116 and reaches the $n^-$-type column region 113; a gate insulation film 120 formed on an inner peripheral surface of the trench 118; a gate electrode 122 buried in the trench 118 by way of the gate insulation film 120; an $n^+$-type source region 124 formed such that the source region 124 is disposed on a front surface of the base region 116, and a portion of the source region 124 is exposed on an inner peripheral surface of the trench 118; an interlayer insulation film 126 configured to cover the base region 116, the source region 124, the gate insulation film 120 and the gate electrode 122; a contact hole 128 formed in a region where at least the $p^-$-type column region 115 exists as viewed from the upper surface side, and penetrates the interlayer insulation film 126 and reaches at least the base region 116; a metal plug 130 formed by filling predetermined metal in the contact hole 128; a $p^+$-type diffusion region 132 formed so as to be in contact with a bottom surface of the metal plug 130 and having higher dopant concentration than the base region 116; the source electrode 134 formed on the interlayer insulation film 126, and electrically connected to the base region 116, the source region 124 and the $p^+$-type diffusion region 132 through the metal plug 130; and a drain electrode 136 formed on the low-resistance semiconductor layer 112.

The gate pad part R2 includes: the low-resistance semiconductor layer 112 used in common with the active element part R1; the $n^-$-type column region 113; the $p^-$-type column region 115; the base region 116 used in common with the active element part R1; the interlayer insulation film 126 used in common with the active element part R1; the gate pad electrode 135 formed on the interlayer insulation film 126; and the drain electrode 136 used in common with the active element part R1. The $n^-$-type column region 113 and the $p^-$-type column region 115 in the gate pad part R2 have substantially the same configuration and the same function as the $n^-$-type column region 113 and the $p^-$-type column region 115 in the active element part R1.

Figure 2:
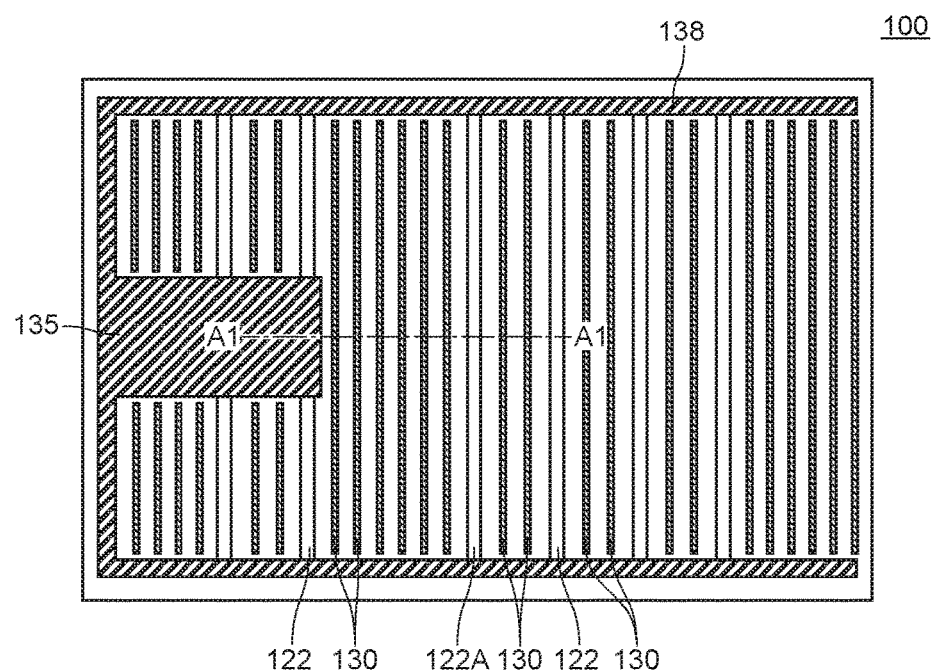
FIG. 2 is a plan view (also referred to as a top plan view) showing a part of the power semiconductor device 100 according to the embodiment 1. Hereinafter, "a plan view showing a part of the power semiconductor device" is simply described as "plan view".

A gate finger 138 is electrically connected to the gate pad electrode 135 (see FIG. 2). As viewed from an upper surface side, a region where the gate finger 138 is formed is included in neither the active element part R1 nor the gate pad part R2.

When the power semiconductor device 100 is viewed on a predetermined cross section (for example, a cross section shown in FIG. 1) being parallel to the predetermined direction and including the gate pad part R2, the active element part R1 includes one $n^-$-type column region 113B between a predetermined $p^-$-type column region 115A disposed closest to the gate pad part R2 among the $p^-$-type column regions 115 and a predetermined $n^-$-type column region 113A disposed closest to the gate pad part R2 among the n⁻-type column regions 113 which are in contact with the trench 118. The n⁻-type column region 113B is the n⁻-type column region 113 which is not in contact with the trench 118 among the n⁻-type column regions 113.

The power semiconductor device 100 may be also referred to as a power semiconductor device where none of the trench 118, the gate insulation film 120 and the gate electrode 122 is formed in one or more regions (one region in the embodiment 1) disposed closest to the gate pad part R2 among the region where the n⁻-type column region 113 exists.

In this embodiment 1, a first conductive-type dopant is an n-type dopant, and a second conductive-type dopant is a p-type dopant. Accordingly, in the power semiconductor device 100, the n⁻-type column region 113 corresponds to a first conductive-type column region, and the p⁻-type column region 115 corresponds to a second conductive-type column region. Further, the source region 124 corresponds to a first conductive-type high concentration diffusion region, and the p⁺-type diffusion region 132 corresponds to a second conductive-type high concentration diffusion region. Further, in this embodiment 1, the source electrode 134 corresponds to an active element electrode.

The predetermined p⁻-type column region 115A is the expression used for identifying the p⁻-type column region 115 disposed at a predetermined position by only giving a particular symbol to the p⁻-type column region 115. Accordingly, the p⁻-type column region 115A has substantially the same configuration as other p⁻-type column regions 115. The substantially same relationship exists between the predetermined n⁻-type column region 113A and the predetermined n⁻-type column region 113B and other n⁻-type column regions 113. Accordingly, in this specification, when the p⁻-type column region 115 is simply described as "p⁻-type column region 115", the p⁻-type column region 115 also includes the predetermined p⁻-type column region 115A. Further, when the n⁻-type column region 113 is simply described as "n⁻-type column region 113", the n⁻-type column region 113 also includes the predetermined n⁻-type column region 113A and the predetermined n⁻-type column region 113B.

The active element part R1 of the power semiconductor device 100 includes plural sets each having the trench 118, the gate insulation film 120 and the gate electrode 122.

In the power semiconductor device 100 according to the embodiment 1, all of the trenches 118, the gate electrodes 122, the source regions 124, the contact holes 128 and the metal plugs 130 are formed in a stripe shape as viewed in a plan view (see FIG. 2). The gate electrodes 122 are connected to the gate pad electrode 135 or the gate finger 138 through connecting portions not shown in the drawings.

An interval (pitch width) of two gate electrodes 122 disposed adjacently to each other is set five or more times as large as a width (stripe width) of the metal plug 130. Further, the interval between two gate electrodes 122 disposed adjacently to each other is 2.5 μm or more, for example. That is, the interval between two gate electrodes 122 is 10 μm, for example.

In this specification and in the respective drawings, among the trenches 118, the gate insulation films 120 and the gate electrodes 122 in the present invention, the trench 118, the gate insulation film 120 and the gate electrode 122 which are disposed closest to the gate pad part R2 when viewed along the predetermined direction are described as a specific trench 118A, a specific gate insulation film 120A and a specific gate electrode 122A respectively. The configurations of the specific trench 118A, the specific gate insulation film 120A and the specific gate electrode 122A are substantially equal to the configurations of the trench 118, the gate insulation film 120 and the gate electrode 122. Accordingly, in this specification, when the trench 118 is simply described as "trench 118", the trench also includes the specific trench 118A, when the gate insulation film 120 is simply described as "gate insulation film 120", the gate insulation film 120 also includes the specific gate insulation film 120A, and when the gate electrode 122 is simply described as "gate electrode 122", the gate electrode 122 also includes the specific gate electrode 122A.

In this specification, "disposed adjacently to each other" is a concept which includes not only a case where constitutional elements are viewed as a whole but also a case where the constitutional elements are viewed on a predetermined cross section. This concept of "disposed adjacently to each other" is described by taking the trenches as an example. For example, in the case where the trenches are formed into a lattice shape so that the trenches are connected to each other, when the trenches are disposed adjacently to each other (are not connected to each other) as viewed on a predetermined cross section, such an example is included in "two trenches disposed adjacently to each other". Further, in this specification, the position which corresponds to "between the constitutional elements disposed adjacently to each other" includes not only the position on a straight line which connects the constitutional elements to each other but also a position slightly displaced from the position on the straight line.

A thickness of the low-resistance semiconductor layer 112 is set to a value which falls within a range of from 100 μm to 400 μm, for example, and dopant concentration in the low-resistance semiconductor layer 112 is set to a value which falls within a range of from $1 \times 10^{19}$ cm⁻³ to $1 \times 10^{20}$ cm⁻³, for example. A distance from a lower surface of the base region 116 to an upper surface of the low-resistance semiconductor layer 112 is set to a value which falls within a range of from 5 μm to 120 μm, for example. Using a boundary surface between the interlayer insulation film 126 and the source region 124 as a reference, a depth position of a deepest portion of the base region 116 is set to a value which falls within a range of from 0.5 μm to 2.0 μm, for example. Dopant concentration in the base region 116 is set to a value which falls within a range of from $5 \times 10^{16}$ cm⁻³ to $1 \times 10^{18}$ cm⁻³, for example.

In the power semiconductor device 100 according to the embodiment 1, the plurality of n⁻-type column regions 113 are connected with each other by the n⁻-type region existing in the vicinity of the low-resistance semiconductor layer 112. It is also safe to say that the n⁻-type column regions 113 are formed of some portions of the parts of n⁻-type region where the p⁻-type column region 115 are not formed.

The plurality of n⁻-type column regions 113 may not be connected to each other. In the present invention, various super junction structures can be used.

In the power semiconductor device 100, the n⁻-type column region 113 and the p⁻-type column region 115 have substantially the same width and hence, a well-balanced charge state is established between the n⁻-type column region 113 and the p⁻-type column region 115. The width of the n⁻-type column region 113 and the width of the p⁻-type column region 115 are respectively set to 6 μm, for example. Dopant concentration in the n⁻-type column region 113 and dopant concentration in the p⁻-type column region 115 are set to values which fall within a range of from $5 \times 10^{14}$ cm⁻³ to $5 \times 10^{16}$ cm⁻³ respectively, for example.

Using a boundary surface between the interlayer insulation film 126 and the source region 124 as a reference, a depth position of a deepest portion of the source region 124 is set to a value which falls within a range of from 0.1 μm to 0.4 μm, for example. Dopant concentration in the source region 124 is set to a value which falls within a range of from $5 \times 10^{19}$ cm$^{-3}$ to $2 \times 10^{20}$ cm$^{-3}$, for example.

A depth of the trench 118 is set to 3 μm, for example. The gate insulation film 120 is formed of a silicon dioxide film formed by a thermal oxidation method and having a thickness of 100 nm, for example. The gate electrode 122 is formed of a low-resistance polysilicon film formed by a CVD method and an ion-implantation method. The interlayer insulation film 126 is formed of a PSG film formed by a CVD method and having a thickness of 1000 nm, for example.

Stripe widths of the contact hole 128 and the metal plug 130 are set to 0.5 μm, for example.

A barrier metal (not shown in the drawing) is formed on an inner surface of the contact hole 128, and the metal plug 130 is formed by filling the inside of the contact hole 128 with predetermined metal with the barrier metal interposed therebetween. The predetermined metal is tungsten, for example.

In the power semiconductor device 100 according to the embodiment 1, the active element part R1 includes the contact holes 128, the metal plugs 130 and the p$^+$-type diffusion regions 132 also in a region where the n$^-$-type column region 113B is formed between the predetermined n$^-$-type column region 113A and the predetermined p$^-$-type column region 115A as viewed from the upper surface side.

In the power semiconductor device 100, as viewed in a predetermined cross section, the active element part R1 includes two sets each having the contact hole 128, the metal plug 130 and the p$^+$-type diffusion region 132 for each region where the p$^-$-type column region 115 is formed as viewed from a front surface side of the n$^-$-type column region 113 and the p$^-$-type column region 115.

Further, in the power semiconductor device 100, the source region 124 is formed between two trenches 118 disposed adjacently to each other and also only between the trench 118 and the metal plug 130 disposed closest to the trench 118. In other words, the source region 124 is not formed between two metal plugs 130 disposed adjacently to each other.

Between two trenches 118 disposed adjacently to each other, the metal plugs 130 are disposed at equal pitches. A distance between a trench 118 and the metal plug 130 disposed closest to the trench 118 is set equal to a distance between two metal plugs 130 disposed adjacently to each other. With such a configuration, it is possible to acquire an advantageous effect that when an avalanche breakdown occurs or reverse recovery of a body diode occurs, carriers (holes) generated in the n$^-$-type column region 113 can be drawn uniformly into the source electrode 134 through the p$^-$-type column regions 115, the base region 116, the p$^+$-type diffusion regions 132, and the metal plugs 130.

An interval between the metal plugs 130 is set equal to or more than a width of the metal plug 130. The interval between the metal plugs 130 is set to 0.5 μm or more, for example.

The p$^+$-type diffusion regions 132 are formed such that a depth position of a deepest portion of the p$^+$-type diffusion region 132 is set deeper than that of the source region 124. Dopant concentration in the p$^+$-type diffusion region 132 is set higher than the dopant concentration in the base region 116, and is set to a value which falls within a range of from $5 \times 10^{18}$ cm$^{-3}$ to $1 \times 10^{20}$ cm$^{-3}$, for example.

The source electrode 134 is made of aluminum-based metal (for example, Al—Cu-based alloy) formed by a sputtering method and having a thickness of 4 μm, for example. The drain electrode 136 is formed of a multilayer metal film made of Ti—Ni—Au or the like, and a whole thickness of the drain electrode 136 in the form of the multilayer metal film is set to 0.5 μm, for example.

Figure 3:
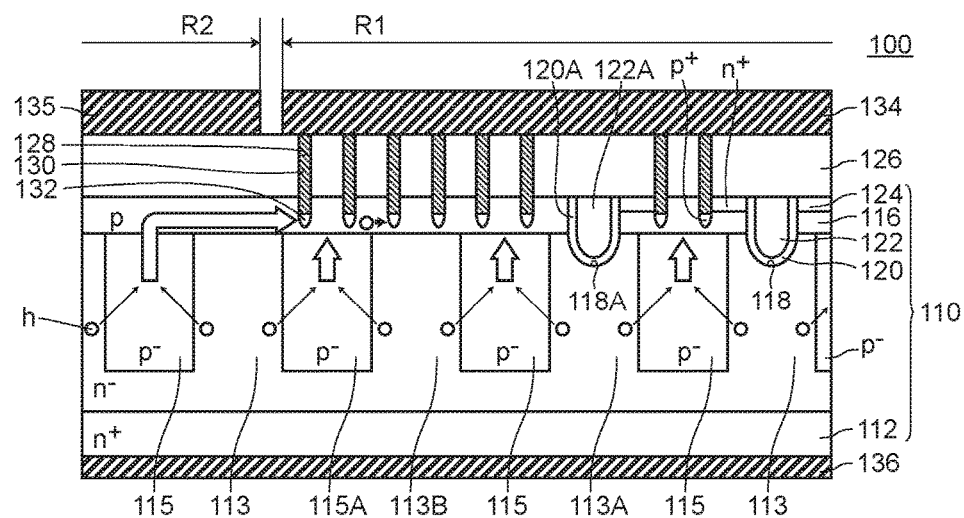
FIG. 3 is a cross-sectional view for describing a state where holes h are drawn into a source electrode 134 through a p⁺-type diffusion region 132 and metal plugs 130 at the time of avalanche breakdown and at the time of reverse recovery of a body diode in the power semiconductor device 100 according to the embodiment 1. Arrows shown in FIG. 3 roughly indicate a moving path of the holes h. Boldness of the arrow is changed so as to simply express an amount of holes h. The path indicated by the bold arrow is the path through which a large amount of holes h move. The same goes for FIG. 18.

In the power semiconductor device 100, behavior of holes h when an avalanche breakdown occurs or reverse recovery of a body diode occurs is shown in FIG. 3. The detail of the behavior of the holes h in the power semiconductor device 100 is described later along with advantageous effects brought about by the power semiconductor device 100.

2. Method of Manufacturing Power Semiconductor Device According to Embodiment 1

The power semiconductor device 100 according to the embodiment 1 can be manufactured by a method of manufacturing a power semiconductor device according to the embodiment 1 described hereinafter.

(1) Semiconductor Base Body 110 Preparing Step

First, the semiconductor base body 110 which includes: the n$^+$-type low-resistance semiconductor layer 112; the plurality of n$^-$-type column regions 113 arranged at a predetermined interval along a predetermined direction; and the plurality of p$^-$-type column regions 115 arranged alternately with the n$^-$-type column regions 113 along the predetermined direction is prepared.

The semiconductor base body 110 having the above-mentioned configuration can be prepared as follows, for example.

Figure 4A:
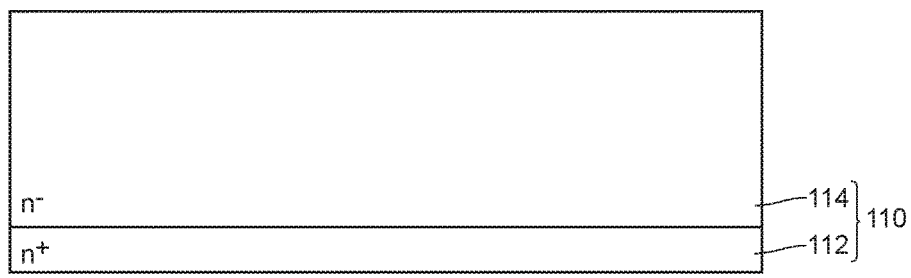
FIG. 4A to FIG. 4D are cross-sectional views for describing a method of manufacturing the power semiconductor device according to the embodiment 1, and also are views showing the respective steps of the method.

First, the semiconductor base body having the n$^+$-type low-resistance semiconductor layer 112 and the n$^-$-type region 114 formed on the low-resistance semiconductor layer 112 is prepared (see FIG. 4A). As such a semiconductor base body 110, a suitable semiconductor base body can be used. For example, a semiconductor base body formed by forming the n$^-$-type region 114 on the n$^+$-type low-resistance semiconductor layer 112 by an epitaxial growth method can be used.

Figure 4B:
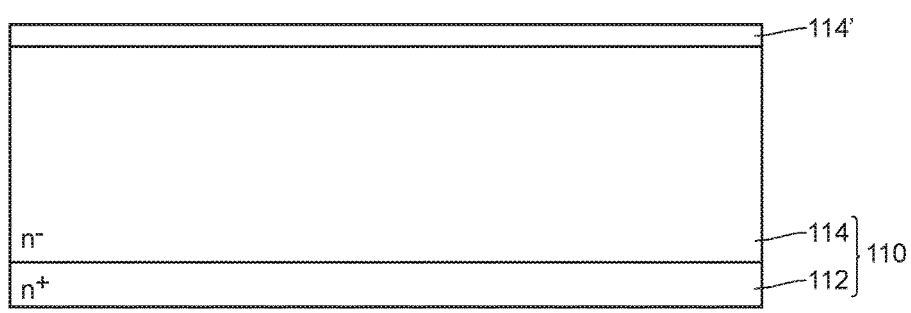
Figure 4C:
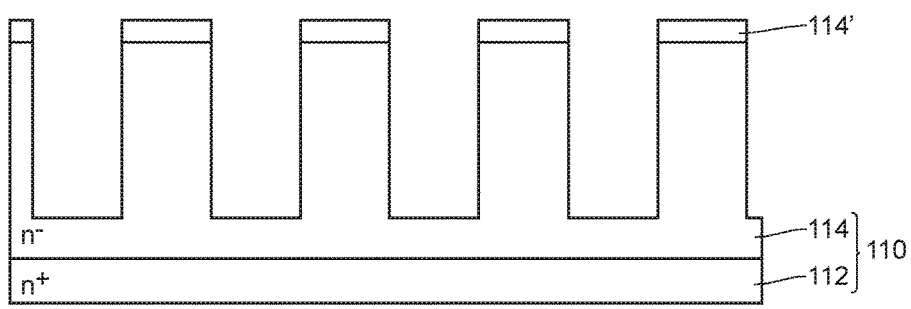
Figure 4D:
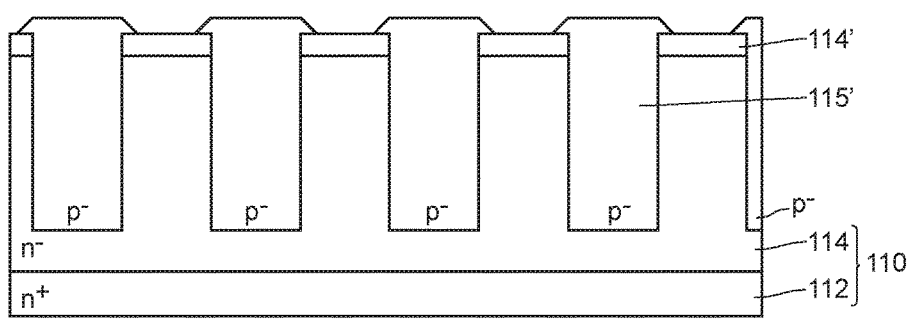
Figure 5A:
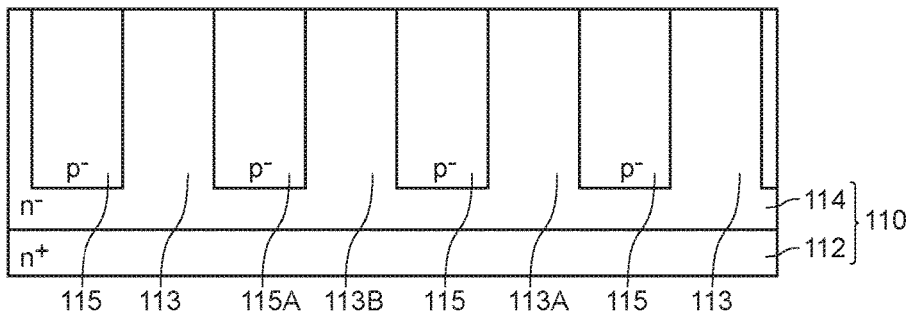
FIG. 5A to FIG. 5D are cross-sectional views for describing a method of manufacturing the power semiconductor device according to the embodiment 1, and also are views showing the respective steps of the method.

Next, a surface of the n$^-$-type region 114 is oxidized thus forming an oxide film 114' (see FIG. 4B). Next, a mask having openings which correspond to the p$^-$-type column regions 115 (not shown in the drawing) is formed on the oxide film 114', and opening portions are formed in the n$^-$-type region 114 by performing etching using the mask (see FIG. 4C). Next, p$^-$-type semiconductor layers 115' are formed by an epitaxial growth method (see FIG. 4D). Then, the p$^-$-type semiconductor layer 115' is removed except for the p$^-$-type semiconductor layer 115' in the inside of the opening portions in the n$^-$-type region 114 by a CMP method, the p$^-$-type column regions 115 are formed and, thereafter, the oxide film 114' is removed by etching (see FIG. 5A).

(2) Trench 118 Forming Step

Figure 5B:
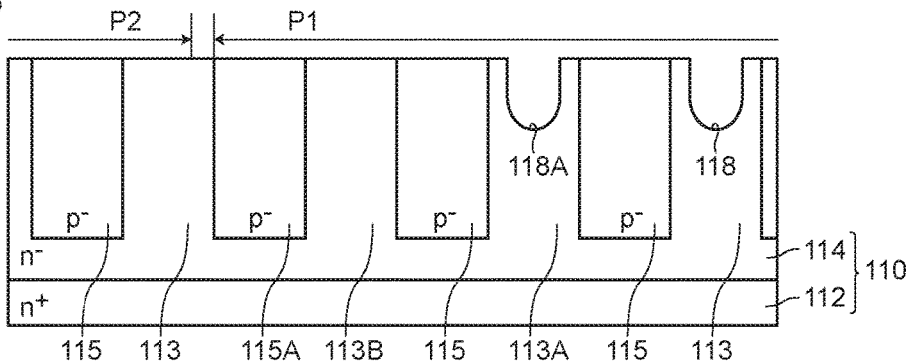

Next, a mask (not shown in the drawing) having openings which correspond to the trenches 118 is formed on a front surface of the n$^-$-type region 114, and etching is performed using the mask thus forming the trench 118 in a region which is defined by the active element part R1 after manufacture and in which the n$^-$-type column region 113 exists as viewed from an upper surface side which is a front surface side of the n$^-$-type column region 113 and the p$^-$-type column region 115 (see FIG. 5B). The mask is removed after etching, and the surfaces of the trenches 118 are made smooth by sacrificial oxidation.

In the trench 118 forming step in the embodiment 1, the trench 118 is formed as described below when the semiconductor base body 110 is viewed on a predetermined cross section which is parallel to a predetermined direction and including the second region P2 defined by the gate pad part R2 after manufacture (a cross section shown in FIG. 5B, for example). That is, the trench 118 is formed such that in the first region P1 defined by the active element part R1 after manufacture, between a predetermined p⁻-type column region 115A disposed closest to the second region P2 among the p⁻-type column regions 115 and the predetermined n⁻-type column region 113A disposed closest to the second region P2 among the n⁻-type column regions 113 which are in contact with the trench 118 after formation of the trench 118, the n⁻-type column region 113B exists.

That is, in the trench 118 forming step in the embodiment 1, the trench 118 is not formed in one or more regions (one region in the embodiment 1) disposed closest to the second region P2 among the regions where the n⁻-type column region 113 exists in the first region P1.

(3) Gate Electrode 122 Forming Step

Figure 5C:
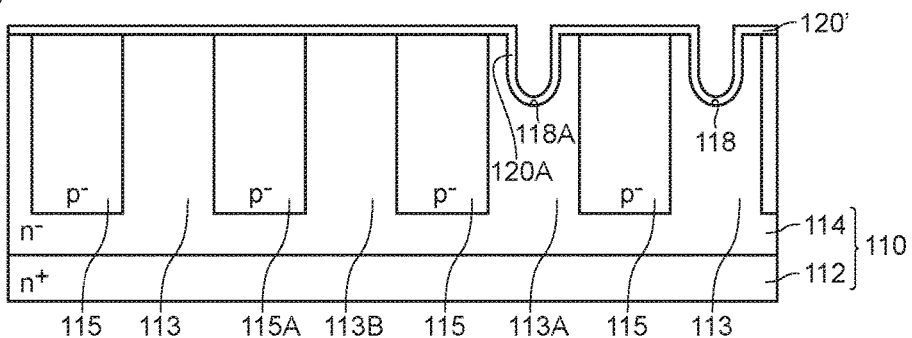
Figure 5D:
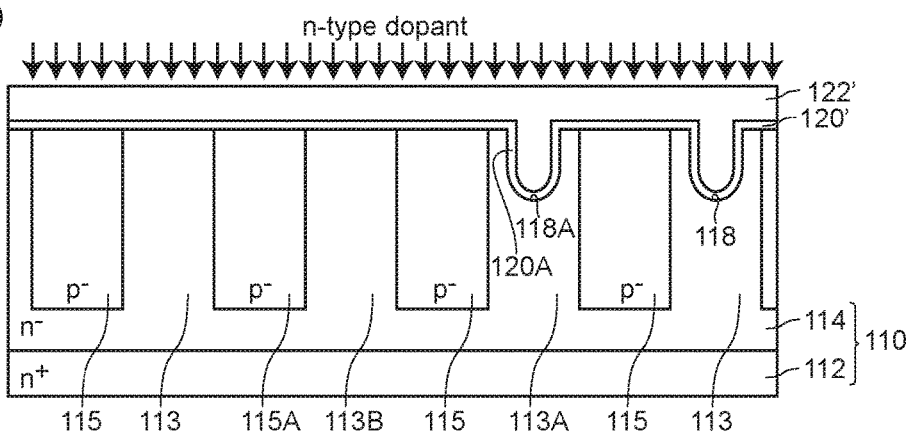

Next, a thermal oxidation film 120' is formed on a front surface of the n⁻-type region 114 including the inner peripheral surface of the trench 118 by thermal oxidation (see FIG. 5C). Then, the thermal oxidation film on the inner peripheral surface of the trench 118 forms the gate insulation film 120. Thereafter, polysilicon 122' is deposited on the thermal oxidation film 120'. Subsequently, an n-type dopant (for example, phosphorus) is injected into the whole surface of the polysilicon 122' by ion-implantation (see FIG. 5D) such that the n-type dopant is thermally diffused. Next, polysilicon is removed except for polysilicon in the trenches 118. With such a treatment, the gate electrode 122 is formed in each trench 118 with the gate insulation film 120 interposed between the trench 118 and the gate electrode 122 (see FIG. 6A).

(4) Base Region 116 Forming Step

Next, a p-type dopant (for example, boron) is injected by ion-implantation into a surface of the n⁻-type column region 113 and a surface of the p⁻-type column region 115 through the thermal oxidation film 120' (see FIG. 6B). Subsequently, by thermally diffusing the p-type dopant, the base region 116 is formed ranging from the surface of the n⁻-type column region 113 and the surface of the p⁻-type column region 115 to a depth position shallower than a lowermost bottom portion of the trench 118 (see FIG. 6C).

(5) Source Region 124 Forming Step (First Conductive-Type High Concentration Diffusion Region Forming Step)

Next, a mask M1 having openings corresponding to the source regions 124, the gate insulation films 120 and the gate electrodes 122 is formed on the thermal oxidation film 120', and an n-type dopant (for example, arsenic) is injected by ion-implantation through the mask M1 (see FIG. 6D). Thereafter, by thermally diffusing the n-type dopant, the source regions 124 each of which has at least a portion thereof exposed to the inner peripheral surface of the trench 118 are formed on a surface of the base region 116 (see FIG. 7A).

(6) Interlayer Insulation Film 126 Forming Step

Next, the interlayer insulation film 126 which covers the base region 116, the source regions 124, the gate insulation films 120, and the gate electrodes 122 is formed (see FIG. 7B). To be more specific, a BPSG film is formed on the thermal oxidation film 120' and the gate electrodes 122 by a CVD method. With such a treatment, the interlayer insulation film 126 formed of the thermal oxidation film 120' and the BPSG film is formed.

(7) Contact Hole 128 Forming Step

Next, a mask (not shown in the drawing) having an opening corresponding to the contact hole 128 is formed on a surface of the interlayer insulation film 126. Next, the contact holes 128 are formed by performing etching using the mask such that the contact holes 128 penetrate the interlayer insulation film 126 and reach the base region 116 within the region which is defined by the active element part R1 after manufacture and within which the p⁻-type column region 115 exists as viewed from a front surface side of the n⁻-type column region 113 and the p⁻-type column region 115. After etching, the mask is removed (see FIG. 7C).

(8) p⁺-Type Diffusion Region 132 Forming Step (Second Conductive-Type High Concentration Diffusion Region Forming Step)

Next, a p-type dopant (for example, boron) is injected into bottom surfaces of the interlayer insulation film 126 and the contact hole 128 by ion-implantation with a higher dopant concentration than the base region 116 (see FIG. 7D). Subsequently, by thermally diffusing the p-type dopant, the p⁺-type diffusion regions 132 which are brought into contact with the bottom surfaces of the contact holes 128 are formed (see FIG. 8A).

(9) Metal Plug 130 Forming Step

Next, a barrier metal (not shown in the drawing) is formed as a film on an inner side surface of each contact hole 128 by a sputtering method, and the barrier metal is activated. Subsequently, by forming a film made of tungsten on the barrier metal by a CVD method, tungsten is filled in the contact hole 128 with the barrier metal interposed therebetween. Next, by removing tungsten on the interlayer insulation film 126 by a CMP method, tungsten remains only in the contact hole 128 thus forming the metal plug 130 (see FIG. 8B). As a composition of the barrier metal, titanium nitride (TiN), titanium tungsten (TiW), molybdenum silicon (MoSi) or the like can be used.

By forming the metal plugs 130, the p⁺-type diffusion regions 132 which are in contact with the bottom surfaces of the contact hole 128 are brought into contact with the bottom surfaces of the metal plugs 130.

(10) Step of Forming Source Electrode 134, Gate Pad Electrode 135 and Drain Electrode 136

Next, an Al—Cu-based alloy is formed as a film on the interlayer insulation film 126 in the first region P1 defined by the active element part R1 after manufacture by a sputtering method thus forming the source electrode 134 which is electrically connected to the base region 116, the source regions 124 and the p⁺-type diffusion regions 132 through the metal plug 130. In the same manner, on the interlayer insulation film 126 in the second region P2 defined by the gate pad part R2 after manufacture, the gate pad electrode 135 which is spaced apart from the source electrode 134 is formed by a sputtering method. Further, in the same manner, the gate finger 138 which is electrically connected to the gate pad electrode 135 is formed on the interlayer insulation film 126 by a sputtering method. The source electrode 134, the gate pad electrode 135 and the gate finger 138 may be collectively formed and, thereafter, may be separated from each other by etching or the like. Alternatively, the source electrode 134, the gate pad electrode 135 and the gate finger 138 may be formed separately from each other.

In this step, the metal film is formed on the low-resistance semiconductor layer 112 in the order of a Ti layer, a Ni layer and an Au layer. In this step, the drain electrode 136 is also formed (FIG. 8C).

In this manner, the power semiconductor device 100 according to the embodiment 1 can be manufactured.

3. Advantages Acquired by Power Semiconductor Device 100 and Method of Manufacturing a Power Semiconductor Device According to Embodiment 1

According to the power semiconductor device 100 according to the embodiment 1, the power semiconductor device 100 includes the metal plugs 130 and hence, in the same manner as the power MOSFET 900, it is unnecessary to form a contact hole having a large diameter whereby a miniaturized power semiconductor device can be manufactured. As a result, the power semiconductor device 100 according to the embodiment 1 becomes a power semiconductor device which can satisfy a demand for reduction in cost and downsizing of electronic equipment.

Further, according to the power semiconductor device 100 of the embodiment 1, the power semiconductor device 100 includes a super junction structure formed of the $n^-$-type column regions 113 and the $p^-$-type column regions 115 where the $n^-$-type column region 113 and the $p^-$-type column region 115 are alternately arranged. Accordingly, in the same manner as the power MOSFET 900, the power semiconductor device 100 according to the embodiment 1 can lower ON resistance while maintaining a high withstand voltage.

According to the power semiconductor device 100 according to the embodiment 1, the power semiconductor device 100 includes the metal plugs 130, and when the power semiconductor device 100 is viewed on a predetermined cross section, the active element part R1 includes the $n^-$-type column region 113B between the predetermined $p^-$-type column region 115A and the predetermined $n^-$-type column region 113A (in other words, the active element part R1 includes the $n^-$-type column region which is not in contact with the trench 118 at the position close to the gate pad part R2). Accordingly, even when the metal plugs 130 have substantially the same configuration as the metal plugs 130 of the power MOSFET 900, a large number of metal plugs 130 can be disposed between the gate pad part R2 and the specific trench 118A. With such a configuration, according to the power semiconductor device 100 of the embodiment 1, even when holes h of electron-hole pairs generated in the gate pad part R2 are not sufficiently recovered by the metal plug 130 in the vicinity of the gate pad part R2, it is possible to recover the holes h by other metal plugs 130 before the holes h pass through an area in the vicinity of the specific trench 118A (see FIG. 3).

As a result, according to the power semiconductor device 100 of the embodiment 1, it is possible to prevent the occurrence of a case where holes h impart damage on the specific gate insulation film 120A, a boundary surface between the specific gate insulation film 120A and the specific gate electrode 122A or a boundary surface between the $n^-$-type column region 113 and the specific gate insulation film 120A when an avalanche breakdown occurs or reverse recovery of a body diode occurs. That is, it is possible to prevent so-called gate breakdown or a change in electric characteristics caused by the deterioration of the specific gate insulation film 120A. Accordingly, it is possible to provide the power semiconductor device 100 according to the embodiment 1 possessing a large breakdown resistance.

Accordingly, as the power semiconductor device 100 according to the embodiment 1, it is possible to provide a power semiconductor device which can satisfy a demand for reduction in cost and downsizing of electronic equipment, can lower ON resistance while maintaining a high withstand voltage, and can possess a large breakdown resistance.

The power semiconductor device 100 according to the embodiment 1 includes contact holes 128, the metal plugs 130 and the $p^+$-type diffusion regions 132 also in the region where the $n^-$-type column region 113B is formed as viewed from an upper surface side. Accordingly, a recovery ratio of holes can be increased by increasing the number of metal plugs 130 existing between the gate pad part R2 and the specific gate insulation film 120A. As a result, it is possible to prevent with more certainty the occurrence of a case where holes impart damage on the specific gate insulation film 120A, a boundary surface between the specific gate insulation film 120A and the specific gate electrode 122A or a boundary surface between the $n^-$-type column region 113 and the specific gate insulation film 120A. That is, it is possible to prevent with more certainty so-called gate breakdown or a change in electric characteristics caused by the deterioration of the specific gate insulation film 120A. Accordingly, it is possible to provide the power semiconductor device 100 according to the embodiment 1 possessing a larger breakdown resistance.

According to the power semiconductor device 100 of this embodiment 1, as viewed on a predetermined cross section, the active element part R1 includes two sets each having the contact holes 128, the metal plugs 130 and the $p^+$-type diffusion regions 132 for each region where the $p^-$-type column region 115 is formed as viewed from an upper surface side. Also with such a configuration, a recovery ratio of holes can be increased by increasing the number of metal plugs 130 existing between the gate pad part R2 and the specific gate insulation film 120A. As a result, it is possible to prevent with more certainty the occurrence of a case where holes impart damage on the specific gate insulation film 120A, a boundary surface between the specific gate insulation film 120A and the specific gate electrode 122A or a boundary surface between the $n^-$-type column region 113 and the specific gate insulation film 120A. That is, it is possible to prevent with more certainty so-called gate breakdown or a change in electric characteristics caused by the deterioration of the specific gate insulation film 120A. Also from this point of view, it is possible to provide the power semiconductor device 100 according to the embodiment 1 possessing a larger breakdown resistance.

According to the power semiconductor device 100 according to the embodiment 1, as viewed on a predetermined cross section, the active element part R1 includes two sets each having the contact holes 128, the metal plugs 130 and the $p^+$-type diffusion regions for each region where the $p^-$-type column region 115 is formed as viewed from a front surface side of the $n^-$-type column region 113 and the $p^-$-type column region 115 and hence, a distance between the trench 118 and the $p^+$-type diffusion region becomes short as viewed in a plan view. Accordingly, when an avalanche breakdown occurs or reverse recovery of a body diode occurs, a moving distance along which carriers (holes) generated on the bottom portion of the trench 118 are drawn into the source electrode 134 becomes short and hence, a high potential difference is minimally generated between the base region 116 and the metal plug 130. Accordingly, a parasitic transistor (parasitic npn transistor) formed of the source region 124 (n-type), the base region 116 (p-type) and the $n^-$-type column region 113 (first conductive-type column region, n-type) is minimally turned on. As a result, the power semiconductor device 100 can further increase breakdown resistance (particularly, resistance against avalanche breakdown or di/dt breakdown of the MOSFET) over the entire semiconductor device.

According to the power semiconductor device 100 according to the embodiment 1, an area of the boundary surface between the source region 124 and the base region 116 becomes narrow so that carriers (holes) in the base region 116 minimally enter the source region 124. Accordingly, the above-mentioned parasitic transistor (parasitic npn transistor) minimally turns on. Also from this point of view, the power semiconductor device 100 can further increase breakdown resistance over the entire semiconductor device.

According to the power semiconductor device 100 according to the embodiment 1, contact resistance can be reduced compared to the case where the active element part R1 includes one set of the contact hole 128, the metal plug 130 and the p⁺-type diffusion region for each region where the p⁻-type column region 115 is formed.

According to the power semiconductor device 100 according to the embodiment 1, the source region 124 is formed between two trenches 118 disposed adjacently to each other and also only between the trench 118 and the metal plug 130 disposed closest to the trench 118. Accordingly, by narrowing the area of "boundary surface between the source region 124 and the base region 116", it is possible to make the holes h minimally enter the source region 124. As a result, it is possible to make the parasitic transistor (parasitic npn transistor) formed of the source region 124 (n-type), the base region 116 (p-type) and the n⁻-type column region 113 (first conductive-type column region, n-type) difficult to turn on.

According to the power semiconductor device 100 according to the embodiment 1, predetermined metal is tungsten. Accordingly, the fine metal plug 130 can be formed using tungsten which can be easily filled in the fine contact hole 128 (having a small diameter or a small width). As a result, it is possible to miniaturize the power semiconductor device 100.

In a power semiconductor device where a source electrode is brought into direct contact with a source region, a stepped portion is formed in a gate electrode between a region where an interlayer insulation film exists and a region where an interlayer insulation film does not exist (contact region). Accordingly, when a wire bonding is performed on the source electrode at the time of mounting the power semiconductor device, there is a possibility that a stress generated by ultrasonic waves is concentrated on the stepped portion (a corner portion of a boundary portion between the interlayer insulation film and the contact region) so that the power semiconductor device is broken. On the other hand, according to the power semiconductor device 100 of the embodiment 1, the contact hole 128 and the metal plug 130 can be made finer by using tungsten and hence, a stepped portion is minimally formed between the region where the interlayer insulation film 126 exists and the region where the interlayer insulation film 126 does not exist (the region where the metal plug 130 is formed). As a result, the source electrode 134 can be formed into a relatively flat film. In this manner, according to the power semiconductor device 100 of the embodiment 1, even when wire bonding is performed on the source electrode 134 at the time of mounting the power semiconductor device 100, it is possible to prevent a stress generated by ultrasonic waves from being concentrated on a portion of the interlayer insulation film 126. As a result, it is possible to prevent breaking of the power semiconductor device 100.

In the power semiconductor device 100 according to the embodiment 1, a distance between two gate electrodes 122 disposed adjacently to each other is set to 2.5 µm or more and hence, gate capacity can be decreased. As a result, it is possible to reduce an amount of charge which a gate drive circuit (connected to the power semiconductor device 100) inputs to the gate electrode 122 or outputs from the gate electrode 122 at the time of switching thus lowering a drive loss.

That is, (1) at the time of turning on the power semiconductor device 100, the gate drive circuit applies a plus bias to the gate electrode 122 so as to supply a gate current to the gate electrode 122. A gate charge amount is obtained by multiplying a gate current amount by an energization time. When the gate capacity is reduced, the gate charge amount is also reduced and hence, a product of the gate current amount and the energization time can be made small. As a result, either the reduction of a gate current amount or the shortening of an energization time becomes possible thus eventually reducing a power loss on a drive circuit side.

(2) At the time of turning off the power semiconductor device 100, the gate drive circuit applies a minus bias or 0 bias to the gate electrode 122 so that a gate current is drawn from the gate electrode 122. At this stage of operation, (a) in the case where a gate charge amount is reduced, when an energization time is shortened while maintaining a gate current amount substantially at the same level as a gate current amount before the gate charge amount is reduced, a product of the gate current amount and the energization time can be made small. Accordingly, an amount of charge which the gate drive circuit inputs to the gate electrode or outputs from the gate electrode can be reduced. As a result, a drive loss can be reduced.

Further, (b) even in the case where a switching speed of the power semiconductor device 100 is intentionally reduced, and a relatively large external gate resistance is inserted between the gate electrode 122 and the gate drive circuit for avoiding the generation of ringing and noises in the circuit, the external gate resistance has an effect of reducing a gate current amount and hence, an energization time can be prolonged whereby a switching time can be prolonged. Accordingly, agate charge amount which is a product of a gate current amount and an energization time is maintained at a small value as it is. As a result, a drive loss can be reduced.

Accordingly, as described in the above-mentioned cases (1) and (2), it is possible to reduce an amount of charge which the gate drive circuit inputs to the gate electrode 122 or outputs from the gate electrode 122 at the time of switching. As a result, a drive loss can be reduced.

When a gate charge amount is reduced, by shortening an energization time while maintaining a gate current amount substantially at the same level as a gate current amount before the gate charge amount is reduced, a switching speed can be increased so that the circuit can be operated at a high speed. However, when a switching speed is increased, a possibility that ringing and noises are generated in the circuit is increased thus increasing a possibility that the power semiconductor device 100 is brought into an avalanche state or a possibility that the power semiconductor device 100 is exposed to steep di/dt at the time of reverse recovery of a body diode. On the other hand, according to the power semiconductor device 100 of the embodiment 1, as described above, a resistance against the breakdown is increased and hence, in an actual operation, a risk that the power semiconductor device 100 is brought into breakdown is reduced.

Further, even in the case where a switching speed of the power semiconductor device 100 is intentionally reduced, and a relatively large external gate resistance is inserted between the gate electrode 122 and the gate drive circuit for avoiding the generation of ringing and noises in the circuit, the external gate resistance has an effect of reducing a gate current amount and hence, an energization time can be prolonged whereby a switching time can be prolonged. As a result, a switching speed becomes slow so that a switching time is prolonged whereby dv/dt becomes gentle so that the generation of ringing and noises in the circuit can be avoided.

In this manner, according to the power semiconductor device 100 of the embodiment 1, since a gate capacity is reduced, an adjustment margin of a switching speed can be widened without losing a drive loss reducing effect. As a result, the power semiconductor device 100 according to the embodiment 1 can satisfy demands in a wide range from various application circuits.

According to the power semiconductor device 100 according to the embodiment 1, a distance between two gate electrodes 122 disposed adjacently to each other is five or more times as large as a width of the metal plug 130 so that the distance between two gate electrodes 122 disposed adjacently to each other is wider than the width of the metal plug 130. Accordingly, a volume of the gate electrode 122 can be made relatively reduced and hence, the gate capacity can be reduced also from this point of view. As a result, an amount of charge which the gate drive circuit inputs to the gate electrode 122 or outputs from the gate electrode 122 at the time of switching can be reduced thus reducing a drive loss.

According to the power semiconductor device 100 according to the embodiment 1, a distance between two gate electrodes 122 disposed adjacently to each other is five or more times as large as a width of the metal plug 130. Also with such a configuration, since a gate capacity is reduced, an adjustment margin of a switching speed can be widened without losing a drive loss reducing effect. As a result, the power semiconductor device 100 according to the embodiment 1 can satisfy demands in a wide range from various application circuits.

According to the power semiconductor device 100 according to the embodiment 1, the contact hole 128 is formed such that the contact hole 128 reaches a depth position deeper than the bottom surface of the source region 124. Accordingly, it is possible to prevent dopant concentration and a region area of the source region 124 from being changed from the dopant concentration and the region area at the time of designing the source region 124 due to contact between the p$^+$-type diffusion region 132 formed on the bottom portion of the contact hole 128 and the source region 124 thus preventing the occurrence of a defect that characteristics of the power semiconductor device 100 change.

According to the power semiconductor device 100 according to the embodiment 1, using a boundary surface between the interlayer insulation film 126 and the source region 124 as a reference, a depth of the base region 116 falls within a range of from 0.5 μm to 2.0 μm and hence, it is unnecessary to diffuse a dopant at a high temperature for a long time in manufacturing steps. Accordingly, it is possible to provide a power semiconductor device suitable for the finer structure.

According to the method of manufacturing a power semiconductor device according to the embodiment 1, the metal plugs 130 are formed, the semiconductor base body 110 which includes the plurality of n$^-$-type column regions 113 and the plurality of p$^-$-type column regions 115 is prepared in the semiconductor base body 110 preparing step, and in the trench 118 forming step, the trenches 118 are formed such that the n$^-$-type column region 113B exists between the predetermined p$^-$-type column region 115A and the predetermined n$^-$-type column region 113A in the first region P1 when the semiconductor base body 110 is viewed on a predetermined cross section. Accordingly, it is possible to manufacture the power semiconductor device 100 according to the embodiment 1 which can satisfy a demand for reduction in cost and downsizing of electronic equipment, can lower ON resistance while maintaining a high withstand voltage, and can possess a large breakdown resistance.

Embodiment 2

Figure 9:
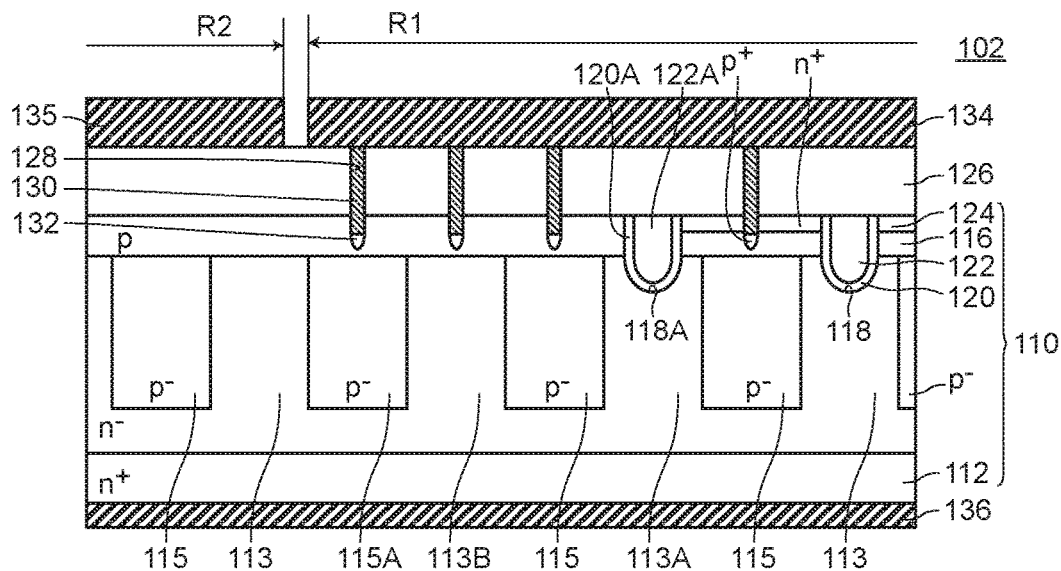
FIG. 9 is a cross-sectional view of a power semiconductor device 102 according to an embodiment 2.

A power semiconductor device 102 according to the embodiment 2 basically has substantially the same configuration as the power semiconductor device 100 according to the embodiment 1. However, the power semiconductor device 102 according to the embodiment 2 differs from the power semiconductor device 100 according to the embodiment 1 with respect to the number of sets each having contact holes, metal plugs and p$^+$-type diffusion regions. That is, in the power semiconductor device 102 according to the embodiment 2, as shown in FIG. 9, an active element part R1 includes one set having the contact holes 128, the metal plugs 130 and the p$^+$-type diffusion regions 132 for each region where the n$^-$-type column region 113 or the p$^-$-type column region 115 is formed as viewed from a front surface side of the n$^-$-type column region 113 and the p$^-$-type column region 115.

The power semiconductor device 102 according to the embodiment 2 differs from the power semiconductor device 100 according to the embodiment 1 with respect to the number of sets each having the contact holes, the metal plugs and the p$^+$-type diffusion regions. However, the power semiconductor device 102 according to the embodiment 2 includes the metal plugs 130, has the super junction structure, and includes the n$^-$-type column region 113B between the predetermined p$^-$-type column region 115A and the predetermined n$^-$-type column region 113A. Accordingly, in the same manner as the power semiconductor device 100 according to the embodiment 1, it is possible to provide the power semiconductor device which can satisfy a demand for reduction in cost and downsizing of electronic equipment, can lower ON resistance while maintaining a high withstand voltage, and can possess a large breakdown resistance.

The power semiconductor device 102 according to the embodiment 2 has substantially the same configuration as the power semiconductor device 100 according to the embodiment 1 except for the number of sets each having the contact holes, the metal plugs and the p$^+$-type diffusion regions. Accordingly, the power semiconductor device 102 according to the embodiment can acquire advantageous effects which correspond to advantageous effects out of advantageous effects which the power semiconductor device 100 according to the embodiment 1 can acquire.

Embodiment 3

Figure 10:
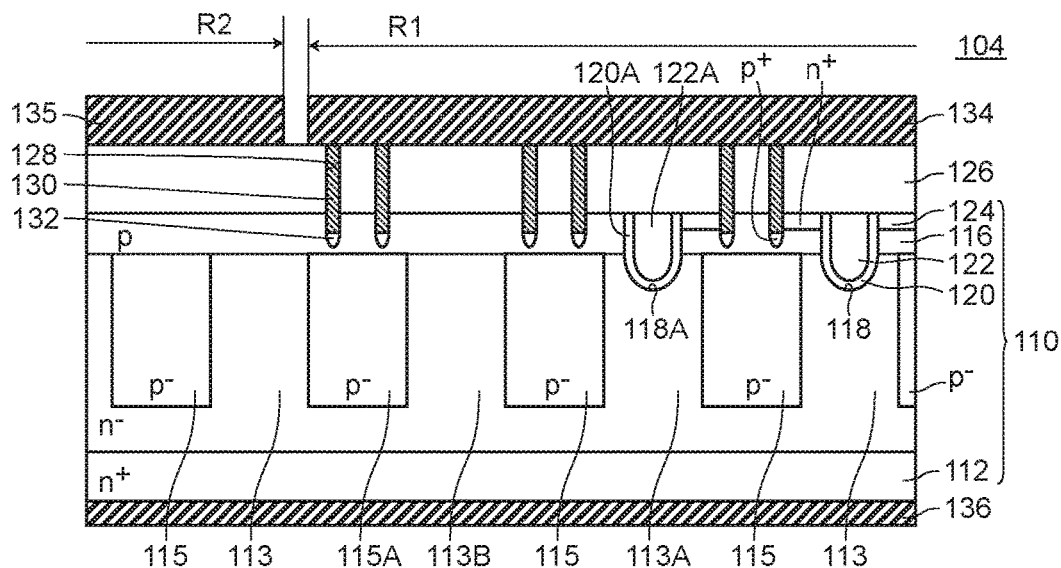
FIG. 10 is a cross-sectional view of a power semiconductor device 104 according to an embodiment 3.

A power semiconductor device 104 according to the embodiment 3 basically has substantially the same configuration as the power semiconductor device 100 according to the embodiment 1. However, the power semiconductor device 104 according to the embodiment 3 differs from the power semiconductor device 100 according to the embodiment 1 with respect to a point that none of contact holes, metal plugs and p$^+$-type diffusion regions are formed in a region where a first conductive-type column region (n$^-$-type column region 113B) is formed as viewed form an upper surface side (see FIG. 10).

The power semiconductor device 104 according to the embodiment 3 differs from the power semiconductor device 100 according to the embodiment 1 with respect to a point that none of the contact holes, the metal plugs and the p$^+$-type diffusion regions are formed in the region where the n$^-$-type column region 113B is formed as viewed form the upper surface side. However, the power semiconductor device 104 according to the embodiment 3 includes the metal plugs 130, has the super junction structure, and includes the n$^-$-type column region 113B between the predetermined p$^-$-type column region 115A and the predetermined n$^-$-type column region 113A. Accordingly, in the same manner as the power semiconductor device 100 according to the embodiment 1, it is possible to provide the power semiconductor device which can satisfy a demand for reduction in cost and downsizing of electronic equipment, can lower ON resistance while maintaining a high withstand voltage, and can possess a large breakdown resistance.

The power semiconductor device 104 according to the embodiment 3 has substantially the same configuration as the power semiconductor device 100 according to the embodiment 1 except for that none of the contact holes, the metal plugs and the p$^+$-type diffusion regions are formed in a region where the n$^-$-type column region 113B is formed as viewed form an upper surface side. Accordingly, the power semiconductor device 104 according to the embodiment 3 can acquire advantageous effects which correspond to advantageous effects out of advantageous effects which the power semiconductor device 100 according to the embodiment 1 can acquire.

Embodiment 4

Figure 11:
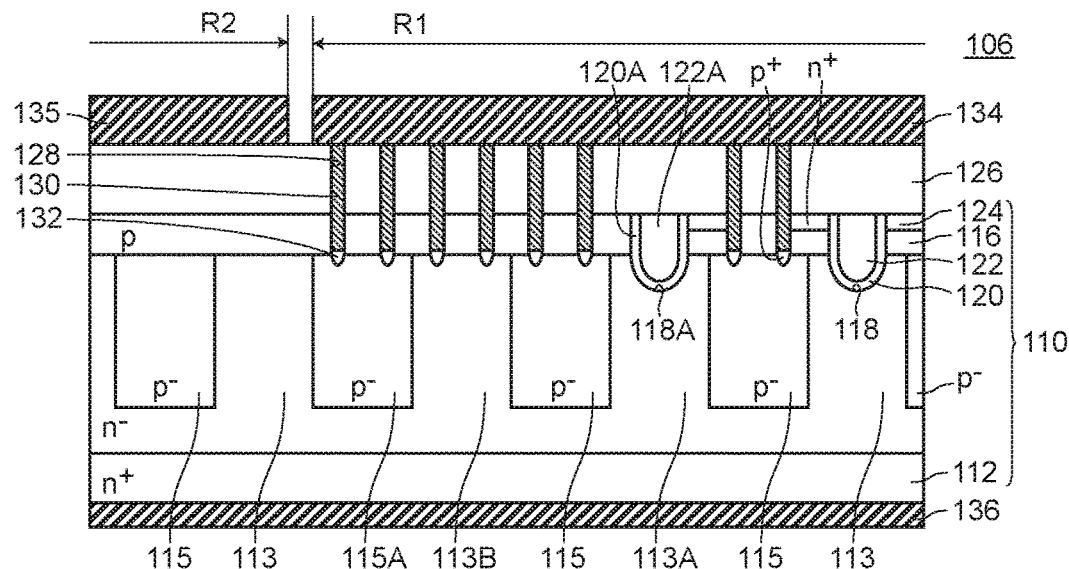
FIG. 11 is a cross-sectional view of a power semiconductor device 106 according to an embodiment 4.

A power semiconductor device 106 according to the embodiment 4 basically has substantially the same configuration as the power semiconductor device 100 according to the embodiment 1. However, the power semiconductor device 106 according to the embodiment 4 differs from the power semiconductor device 100 according to the embodiment 1 with respect to depths of contact holes, metal plugs and p$^+$-type diffusion regions. That is, in the power semiconductor device 106 according to the embodiment 4, as shown in FIG. 11, the p$^+$-type diffusion regions 132 are formed such that the p$^+$-type diffusion regions 132 penetrate a base region 116 from bottom surfaces of the metal plugs 130 and reach p$^-$-type column regions 115. Further, in the embodiment 4, along with the above-mentioned configuration, the depths of the contact holes 128 and the metal plugs 130 are set deeper than the depths of the corresponding contact holes 128 and metal plugs 130 in the embodiment 1.

In this manner, the power semiconductor device 106 according to the embodiment 4 differs from the power semiconductor device 100 according to the embodiment 1 with respect to the depths of the contact holes, the metal plugs and the p$^+$-type diffusion regions. However, the power semiconductor device 106 according to the embodiment 4 includes the metal plugs 130, has the super junction structure, and includes the n$^-$-type column region 113B between the predetermined p$^-$-type column region 115A and the predetermined n$^-$-type column region 113A. Accordingly, in the same manner as the power semiconductor device 100 according to the embodiment 1, it is possible to provide the power semiconductor device which can satisfy a demand for reduction in cost and downsizing of electronic equipment, can lower ON resistance while maintaining a high withstand voltage, and can possess a large breakdown resistance.

Further, according to the power semiconductor device 106 of the embodiment 4, the p$^+$-type diffusion regions 132 are formed such that the p$^+$-type diffusion regions 132 penetrate a base region 116 from the bottom surfaces of the metal plugs 130 and reach p$^-$-type column regions 115. That is, the p$^+$-type diffusion region 132 is deeply formed and hence, field intensity in the vicinity of a boundary surface between a bottom portion of the p$^+$-type diffusion region 132 and the p$^-$-type column region 115 is increased. Accordingly, impact ionization is likely to occur in the vicinity of the boundary surface and hence, electron-hole pairs are likely to be generated when avalanche breakdown occurs. Holes and electrons of electron-hole pairs generated in the vicinity of the boundary surface do not pass an area near the gate insulation film 120 and are recovered by the source electrode 134 through the p$^+$-type diffusion region 132 and the metal plug 130 existing in the vicinity of the position where holes or electrons of electron-hole pairs are generated. As a result, in the power semiconductor device 106 according to the embodiment 4, a change in electric characteristics caused by gate breakdown due to avalanche breakdown or the deterioration of the gate insulation film 120 minimally occurs. In this manner, according to the power semiconductor device 106 of the embodiment 4, breakdown resistance of the entire semiconductor device can be further increased.

According to the power semiconductor device 106 of the embodiment 4, field intensity is dispersed due to the existence of the p$^+$-type diffusion regions 132 which reach the p$^-$-type column region 115 so that field intensity in the vicinity of the boundary surface between the bottom portion of the trench 118 and the n$^-$-type column region 113 is reduced. That is, in the power semiconductor device 106 according to the embodiment 4, a degree that the holes generated when avalanche breakdown occurs are accelerated by an electric field (energy of carriers) is decreased and hence, a change in electric characteristics caused by gate breakdown due to avalanche breakdown or the deterioration of the gate insulation film 120 minimally occurs. In this manner, according to the power semiconductor device 106 of the embodiment 4, breakdown resistance of the entire semiconductor device can be further increased also from this point of view.

The power semiconductor device 106 according to the embodiment 4 has substantially the same configuration as the power semiconductor device 100 according to the embodiment 1 except for the depths of the contact holes 128, the metal plugs 130 and the p$^+$-type diffusion regions. Accordingly, the power semiconductor device 106 according to the embodiment 4 can acquire advantageous effects which correspond to advantageous effects out of advantageous effects which the power semiconductor device 100 according to the embodiment 1 can acquire.

Embodiment 5

Figure 12:
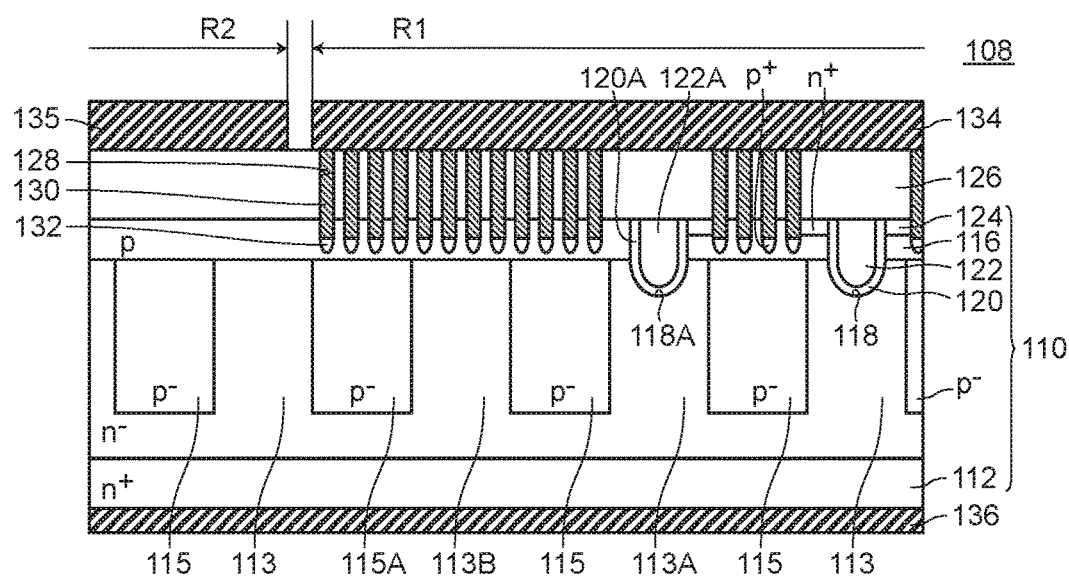
FIG. 12 is a cross-sectional view of a power semiconductor device 108 according to an embodiment 5.

A power semiconductor device 108 according to the embodiment 5 basically has substantially the same configuration as the power semiconductor device 100 according to the embodiment 1. However, the power semiconductor device 108 according to the embodiment 5 differs from the power semiconductor device 100 according to the embodiment 1 with respect to the number of sets each having contact holes, metal plugs and p$^+$-type diffusion regions. That is, in the power semiconductor device 108 according to the embodiment 5, as shown in FIG. 12, an active element part R1 includes four sets each having the contact holes 128, the metal plugs 130 and the p$^+$-type diffusion regions 132 for each region where the n⁻-type column region 113 or the p⁻-type column region 115 is formed as viewed from an upper surface side as viewed on a predetermined cross section.

The number of sets each having contact holes, metal plugs and second conductive-type high concentration diffusion regions (p⁺-type diffusion regions in the above-mentioned respective embodiments) is not limited to one set, two sets or four sets. The power semiconductor device of the present invention may have three sets or five or more sets each having the contact holes, the metal plugs and the second conductive-type high concentration diffusion regions for each region where the first conductive-type column region or the second conductive-type column region is formed as viewed from an upper surface side. The number of sets in one first conductive-type column region and the number of sets in one second conductive-type column region may be equal to each other or may be different from each other. Further, the power semiconductor device of the present invention may include the contact holes, the metal plugs and the second conductive-type high concentration diffusion region on a boundary between the region where the first conductive-type column region is formed and the region where the second conductive-type column region is formed.

The power semiconductor device 108 according to the embodiment 5 differs from the power semiconductor device 100 according to the embodiment 1 with respect to the number of sets each having the contact holes, the metal plugs and the p⁺-type diffusion regions. However, the power semiconductor device 108 according to the embodiment 5 includes the metal plugs 130, has the super junction structure, and includes the n⁻-type column region 113B between the predetermined p⁻-type column region 115A and the predetermined n⁻-type column region 113A. Accordingly, in the same manner as the power semiconductor device 100 according to the embodiment 1, it is possible to provide the power semiconductor device which can satisfy a demand for reduction in cost and downsizing of electronic equipment, can lower ON resistance while maintaining a high withstand voltage, and can possess a large breakdown resistance.

The number of sets each having the contact holes 128, the metal plugs 130 and the p⁺-type diffusion regions 132 in one region in the power semiconductor device 108 according to the embodiment 5 is larger than the number of sets each having the contact holes 128, the metal plugs 130 and the p⁺-type diffusion regions 132 in one region in the power semiconductor device 100 according to the embodiment 1. Accordingly, contact resistance can be further reduced.

The power semiconductor device 108 according to the embodiment 5 has substantially the same configuration as the power semiconductor device 100 according to the embodiment 1 except for the number of sets each having the contact holes, the metal plugs and the p⁺-type diffusion region. Accordingly, the power semiconductor device 108 according to the embodiment can acquire advantageous effects which correspond to advantageous effects out of advantageous effects which the power semiconductor device 100 according to the embodiment 1 can acquire.

Although the present invention has been described heretofore with reference to the above-mentioned embodiments, the present invention is not limited to the above-mentioned embodiments. Various modifications are conceivable without departing from the gist of the present invention. For example, the following modifications are also conceivable.

(1) The number, materials, shapes, positions, sizes and the like of the constitutional elements described in the above-mentioned embodiments are merely examples, and can be changed within a range where the advantageous effects of the present invention are not impaired.

Figure 13:
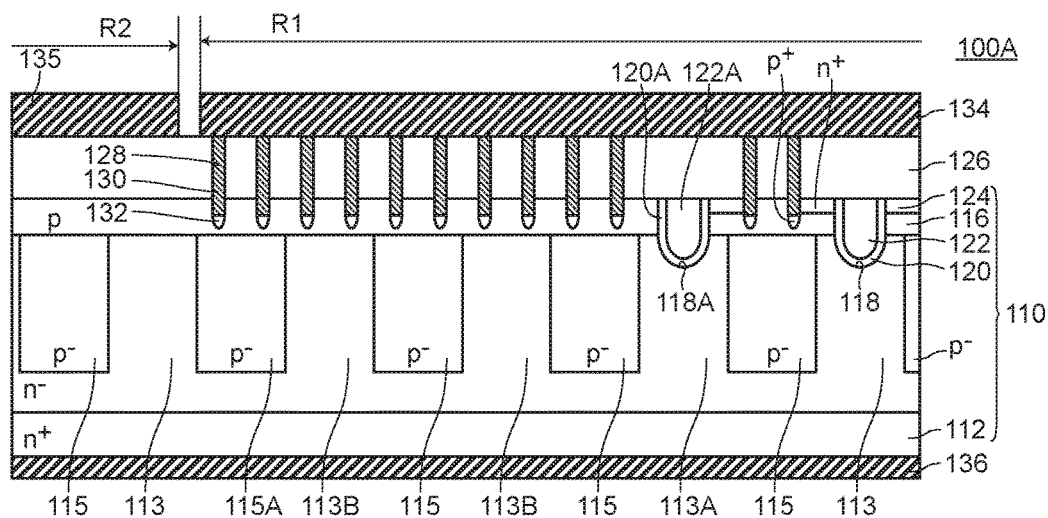
FIG. 13 is a cross-sectional view of a power semiconductor device 100A according to a modification 1.

(2) In the above-mentioned respective embodiments, the description has been made by taking a case where the number of n⁻-type column regions 113B between the predetermined p⁻-type column region 115A and the predetermined n⁻-type column region 113A is one as an example. However, the present invention is not limited to such a case. The number of n⁻-type column regions 113B between the predetermined p⁻-type column region 115A and the predetermined n⁻-type column region 113A may be two or more (see modification 1 shown in FIG. 13, for example).

(3) In the above-mentioned respective embodiments, the description has been made with respect to the case where the metal plugs 130 and the contact holes 128 are formed in a stripe shape as viewed in a plan view (see FIG. 2). However, the present invention is not limited to such a case. The metal plugs and the contact holes may be formed in a circular shape (a columnar shape as viewed stereoscopically), a quadrangular frame shape, a circular frame shape, a grid-like shape or the like as viewed in a plan view.

(4) In the above-mentioned respective embodiments, the description has been made with respect to the case where the gate electrodes 122 and the trenches 118 are formed in a stripe shape as viewed in a plan view (see FIG. 2). However, the present invention is not limited to such a case. The gate electrodes and the trenches may be formed in a grid-like shape, a quadrangular frame shape (a columnar shape as viewed stereoscopically) or the like as viewed in a plan view.

Figure 14:
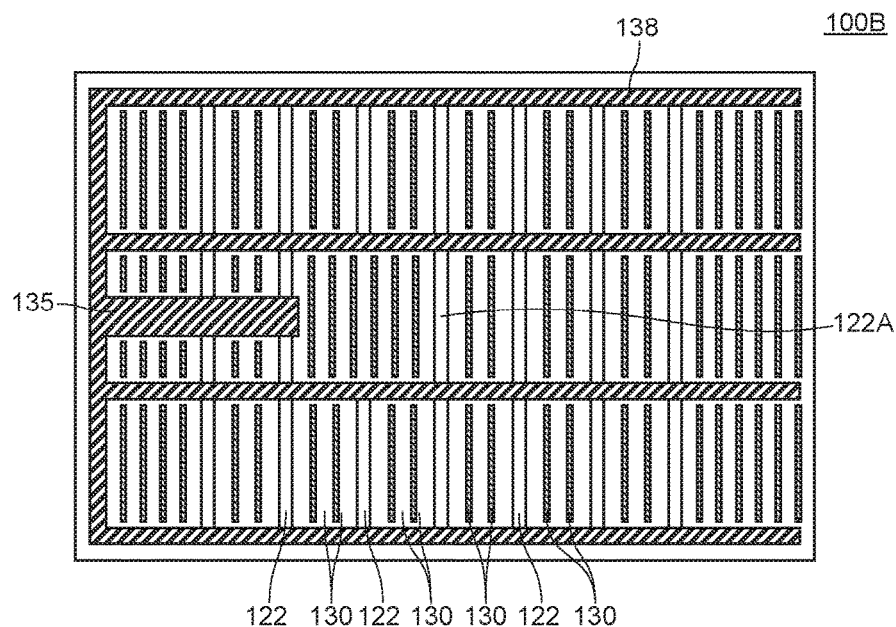
FIG. 14 is a plan view of a power semiconductor device 100B according to a modification 2.

(5) The present invention is also applicable to a power semiconductor device where trenches and metal plugs are disposed outside a gate finger (see modification 2 shown in FIG. 14, for example).

(6) In the above-mentioned respective embodiments, the description has been made with respect to the case where the present invention is applied to the MOSFET as an example of the power semiconductor device. However, the present invention is not limited to such a case. The present invention is applicable to a suitable power semiconductor device such as an IGBT, a thyrister, a triac or a diode as the power semiconductor device.

(7) In the above-mentioned respective embodiments, the description has been made with respect to the case where the contact holes 128 are formed such that the contact holes 128 reach the base region 116. However, the present invention is not limited to such a case. The contact holes are formed such that the contact holes reach the second conductive-type column region. In this case, the present invention can further acquire an advantageous effect that holes can be drawn into the source electrode more easily when avalanche breakdown occurs.

Figure 15:
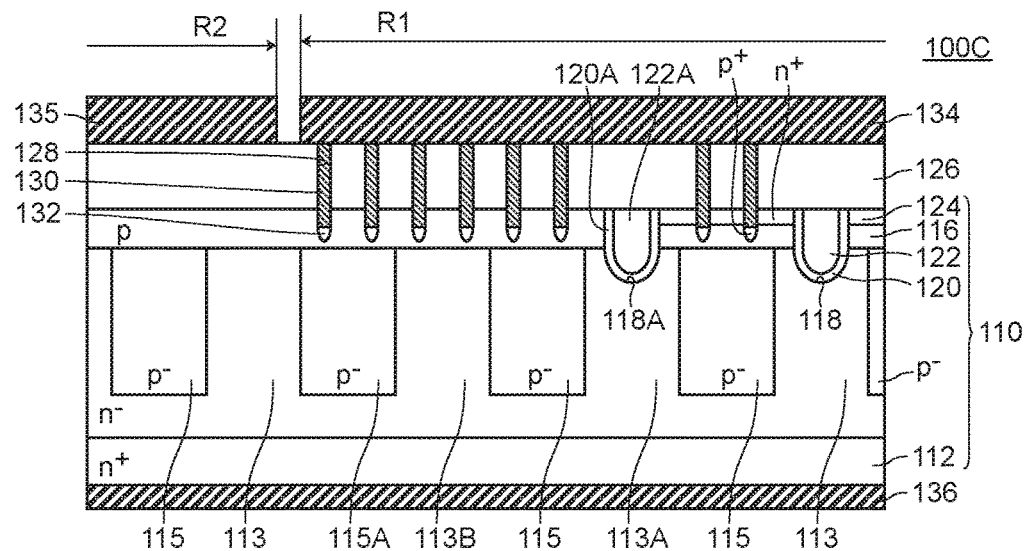
FIG. 15 is a cross-sectional view of a power semiconductor device 100C according to a modification 3.

(8) In the above-mentioned embodiments 1, 3, 4 and 5 and modification 1, the description has been made with respect to the case where the source region 124 is formed between two trenches 118 disposed adjacently to each other and also only between the trench 118 and the metal plug 130 disposed closest to the trench 118. However, the present invention is not limited to such a case. For example, the source region 124 may be formed between the metal plugs 130 disposed adjacently to each other (see FIG. 15).

Figure 16:
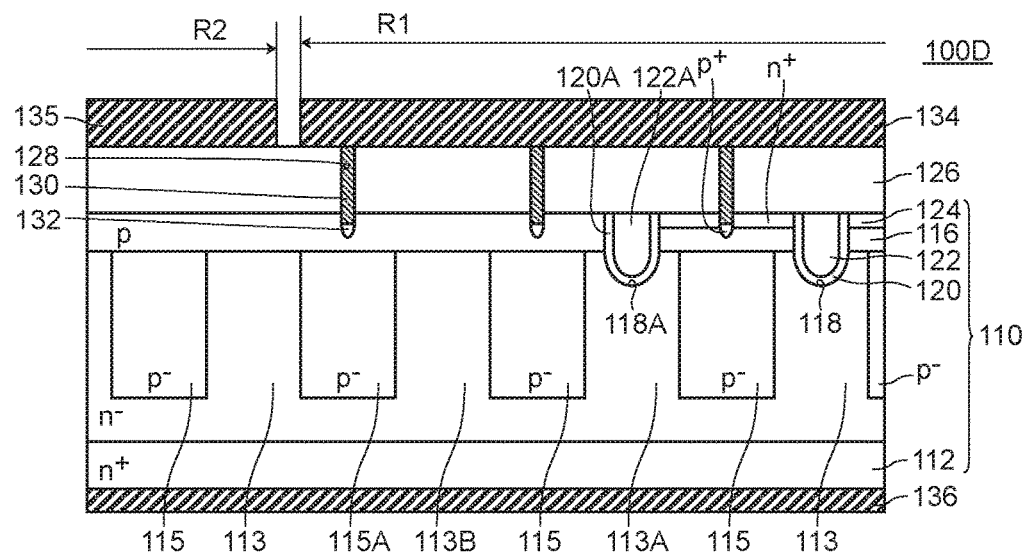
FIG. 16 is a cross-sectional view of a power semiconductor device 100D according to a modification 4.
Figure 17:
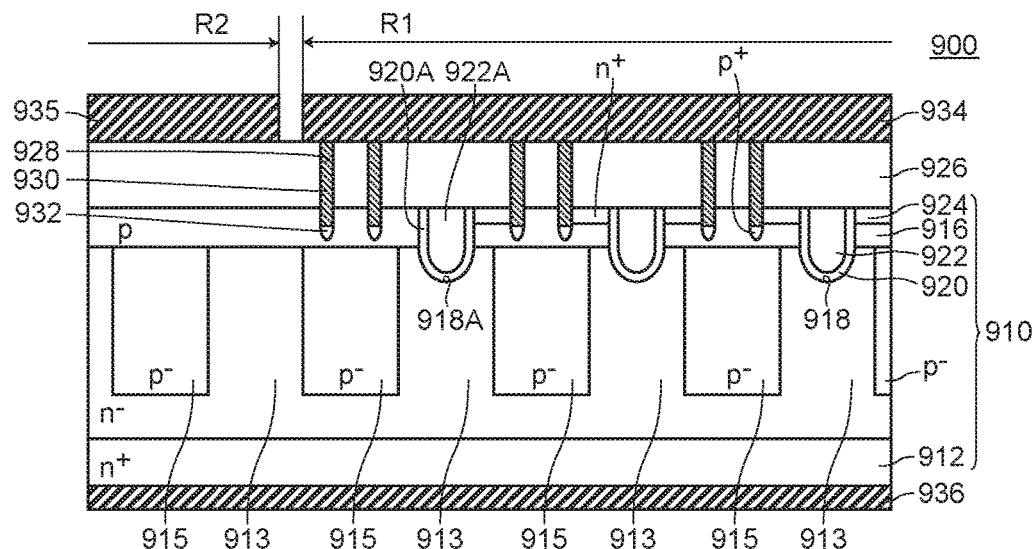
FIG. 17 is a cross-sectional view of a power MOSFET 900 according to Background Art. Symbol 910 indicates a semiconductor base body.
Figure 18:
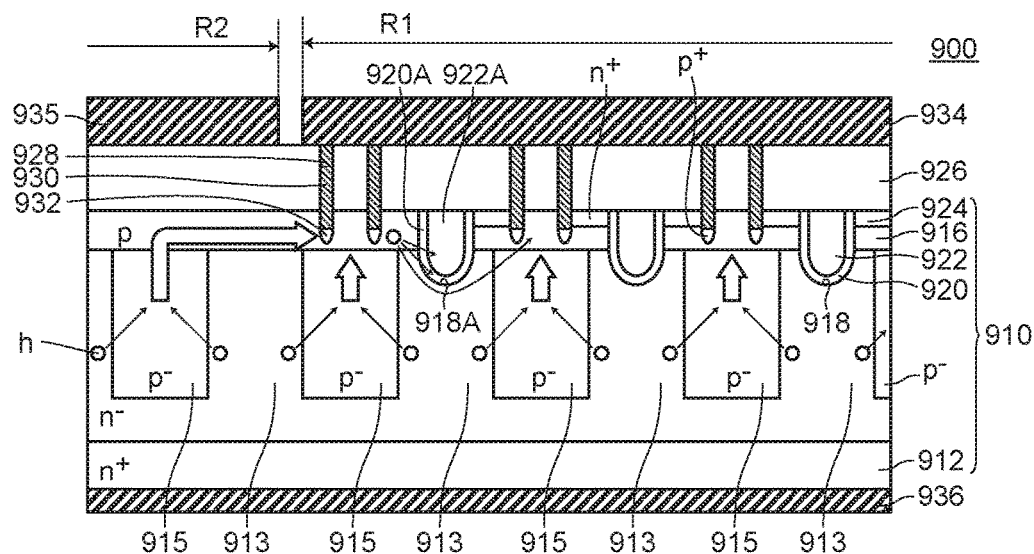
FIG. 18 is a cross-sectional view for describing a state where holes h are drawn into a source electrode 934 through a $p^+$-type diffusion region 932 and metal plugs 930 at the time of avalanche breakdown and at the time of reverse recovery of a body diode in the power MOSFET 900 according to Background Art.

(9) In the above-mentioned embodiments and modifications, the description has been made with respect to the case where the contact holes 128 are formed such that the contact holes 128 extend to the depth position deeper than the bottom surface of the source region 124. However, the present invention is not limited to such a case. The contact holes 128 may be formed such that the contact holes 128 extend to a depth position shallower than the bottom surface of the source region 124 (see FIG. 16).

The invention claimed is:

1. A power semiconductor device having a super junction structure formed of first conductive-type column regions and second conductive-type column regions where the first conductive-type column region and the second conductive-type column region are alternately arranged, and defining: an active element part which is a region where an active element electrode is formed as viewed from an upper surface side which is a front surface side of the first conductive-type column region and a front surface of the second conductive-type column region; and a gate pad part which is a region where a gate pad electrode is formed as viewed from the upper surface side, wherein the active element part includes:
a low-resistance semiconductor layer;
a plurality of the first conductive-type column regions arranged at a predetermined interval along a predetermined direction;
a plurality of the second conductive-type column regions arranged alternately with the first conductive-type column regions along the predetermined direction;
a second conductive-type base region formed on a front surface of the first conductive-type column region and a front surface of the second conductive-type column region;
a trench formed in a region where the first conductive-type column region exists as viewed from the upper surface side, and is formed up to a depth position where the trench penetrates the base region and reaches the first conductive-type column region;
a gate insulation film formed on an inner peripheral surface of the trench;
a gate electrode buried in the trench by way of the gate insulation film;
a first conductive-type high concentration diffusion region formed such that the diffusion region is disposed on a front surface of the base region, and at least a portion of the diffusion region is exposed on the inner peripheral surface of the trench;
an interlayer insulation film configured to cover at least the first conductive-type high concentration diffusion region, the gate insulation film and the gate electrode;
a contact hole formed in a region where at least the second conductive-type column region exists as viewed from the upper surface side, penetrates the interlayer insulation film and reaches at least the base region;
a metal plug formed by filling predetermined metal in the contact hole;
a second conductive-type high concentration diffusion region formed so as to be in contact with a bottom surface of the metal plug and having higher dopant concentration than the base region; and
the active element electrode formed on the interlayer insulation film, and electrically connected to the base region, the first conductive-type high concentration diffusion region and the second conductive-type high concentration diffusion region through the metal plug, the gate pad part includes:
the low-resistance semiconductor layer used in common with the active element part;
the first conductive-type column region;
the second conductive-type column region;
the base region used in common with the active element part;
the interlayer insulation film used in common with the active element part; and
the gate pad electrode formed on the interlayer insulation film, wherein
when the power semiconductor device is viewed on a predetermined cross section being parallel to the predetermined direction and including the gate pad part, the active element part includes one or more first conductive-type column regions between a predetermined second conductive-type column region disposed closest to the gate pad part among the second conductive-type column regions and a predetermined first conductive-type column region disposed closest to the gate pad part among the first conductive-type column regions which are in contact with the trench.

2. The power semiconductor device according to claim 1, wherein the active element part includes the contact hole, the metal plug and the second conductive-type high concentration diffusion region also in a region where the first conductive-type column region is formed between the predetermined first conductive-type column region and the predetermined second conductive-type column region as viewed from the upper surface side.

3. The power semiconductor device according to claim 1, wherein as viewed on the predetermined cross section, the active element part includes plural sets of the contact hole, the metal plug and the second conductive-type high concentration diffusion region per each region where the second conductive-type column region is formed as viewed from the upper surface side.

4. The power semiconductor device according to claim 1, wherein the active element part includes plural sets of the trench, the gate insulation film and the gate electrode, and
in the active element part, the first conductive-type high concentration diffusion region is formed between two trenches disposed adjacently to each other and also only between the trench and the metal plug disposed closest to the trench.

5. The power semiconductor device according to claim 1, wherein the predetermined metal is tungsten.

6. The power semiconductor device according to claim 1, wherein the active element part includes plural sets of the trench, the gate insulation film and the gate electrode, and
in the active element part, a distance between two gate electrodes disposed adjacently to each other is 2.5 μm or more.

7. The power semiconductor device according to claim 1, wherein the active element part includes plural sets of the trench, the gate insulation film and the gate electrode, and
in the active element part, a distance between two gate electrodes disposed adjacently to each other is 5 or more times as large as a width of the metal plug.

8. The power semiconductor device according to claim 1, wherein the contact hole is formed up to a depth position which is deeper than a bottom surface of the first conductive-type high concentration diffusion region.

9. The power semiconductor device according to claim 1, wherein using a boundary surface between the interlayer insulation film and the first conductive-type high concentration diffusion region as a reference, a depth position of a deepest portion of the base region is set to a value which falls within a range of from 0.5 μm to 2.0 μm.

10. The power semiconductor device according to claim 1, wherein the second conductive-type high concentration diffusion region is formed such that the diffusion region penetrates the base region from the bottom surface of the metal plug and reaches the second conductive-type column region or the first conductive-type column region.

11. A method of manufacturing a power semiconductor device for manufacturing the power semiconductor device according to claim 1, the method comprising in the following order:
- a semiconductor base body preparing step of preparing a semiconductor base body having a low-resistance semiconductor layer, the plurality of first conductive-type column regions arranged at a predetermined interval along a predetermined direction and the plurality of the second conductive-type column regions arranged alternatively with the first conductive-type column regions along the predetermined direction;
- a trench forming step of forming a trench in a region which is defined by the active element part after manufacture and in which the first conductive-type column region exists as viewed from an upper surface side which is a front surface side of the first conductive-type column region and a front surface side of the second conductive-type column region;
- a gate electrode forming step of forming a gate electrode in the trench by way of the gate insulation film after formation of a gate insulation film on an inner peripheral surface of the trench;
- a base region forming step of forming a second conductive-type base region up to a depth position shallower than a lowermost bottom portion of the trench from front surfaces of the first conductive-type column region and the second conductive-type column region;
- a first conductive-type high concentration diffusion region forming step of forming the first conductive-type high concentration diffusion region on a front surface of the base region such that at least a portion of the first conductive-type high concentration diffusion region is exposed on an inner peripheral surface of the trench;
- an interlayer insulation film forming step of forming an interlayer insulation film which covers at least the first conductive-type high concentration diffusion region, the gate insulation film and the gate electrode;
- a contact hole forming step of forming a contact hole in a region which is defined by the active element part after manufacture and in which at least the second conductive-type column region exists as viewed from the upper surface side such that the contact hole penetrates the interlayer insulation film and reaches at least the base region;
- a second conductive-type high concentration diffusion region forming step of forming the second conductive-type high concentration diffusion region which is in contact with a bottom surface of the contact hole and has higher dopant concentration than the base region;
- a metal plug forming step of forming a metal plug by filling predetermined metal in the contact hole; and
- an electrode forming step of forming an active element part electrode which is electrically connected to the base region, the first conductive-type high concentration diffusion region and the second conductive-type high concentration diffusion region through the metal plug on the interlayer insulation film in the first region defined by the active element part after manufacture, and a gate pad electrode which is spaced apart from the active element part electrode on the interlayer insulation film in the second region defined by the gate pad part after manufacture, wherein
- in the trench forming step, the trench is formed such that, when the semiconductor base body is viewed on a predetermined cross section being parallel to the predetermined direction and including the second region, in the first region, between a predetermined second conductive-type column region disposed closest to the second region among the second conductive-type column regions and a predetermined first conductive-type column region disposed closest to the second region among the first conductive-type column regions which are in contact with the trench after formation of the trench, one or more first conductive-type column regions exist.

* * * * *